(12) United States Patent
Haaheim et al.

(10) Patent No.: US 8,256,018 B2
(45) Date of Patent: Aug. 28, 2012

(54) ARRAY AND CANTILEVER ARRAY LEVELING

(75) Inventors: Jason Haaheim, Chicago, IL (US); Vadim Val-Khvalabov, Chicago, IL (US)

(73) Assignee: NanoInk, Inc., Skokie, IL (US)

( * ) Notice: Subject to any disclaimer, the term of this patent is extended or adjusted under 35 U.S.C. 154(b) by 601 days.

(21) Appl. No.: 12/320,842

(22) Filed: Feb. 5, 2009

(65) Prior Publication Data
US 2009/0205091 A1   Aug. 13, 2009

Related U.S. Application Data

(60) Provisional application No. 61/026,196, filed on Feb. 5, 2008.

(51) Int. Cl.
*G01Q 60/24*   (2010.01)
(52) U.S. Cl. .................. 850/33; 850/10; 850/5; 850/40; 850/56; 850/60
(58) Field of Classification Search .................. 250/306, 250/307; 850/10, 33, 5, 40, 56, 60
See application file for complete search history.

(56) References Cited

U.S. PATENT DOCUMENTS

| | | | |
|---|---|---|---|
| 5,443,791 A | 8/1995 | Cathcart et al. | |
| 5,981,733 A | 11/1999 | Gamble et al. | |
| 6,573,369 B2 | 6/2003 | Henderson et al. | |
| 6,635,311 B1 | 10/2003 | Mirkin et al. | |
| 6,642,129 B2 | 11/2003 | Liu et al. | |
| 6,787,313 B2 | 9/2004 | Morozov et al. | |
| 6,827,979 B2 | 12/2004 | Mirkin et al. | |
| 6,867,443 B2 | 3/2005 | Liu et al. | |
| 6,998,228 B2 | 2/2006 | Henderson et al. | |
| 7,005,378 B2 | 2/2006 | Crocker et al. | |
| 7,008,769 B2 | 3/2006 | Henderson et al. | |
| 7,034,854 B2 | 4/2006 | Cruchon-Dupeyrat et al. | |
| 7,060,056 B2 | 6/2006 | Palasis et al. | |
| 7,102,656 B2 | 9/2006 | Mirkin et al. | |
| 2002/0122873 A1 | 9/2002 | Mirkin et al. | |
| 2003/0005755 A1 | 1/2003 | Schwartz | |
| 2003/0007242 A1 | 1/2003 | Schwartz | |

(Continued)

FOREIGN PATENT DOCUMENTS

EP   1 388 369 A   2/2004

(Continued)

OTHER PUBLICATIONS

Salaita et al., "Massively parallel dip-pen nanolithography with 55 000-pen tow-dimensional arrays", *Agnew. Chem. Int. Ed.*, vol. 45, pp. 7220-7223 (2006).

(Continued)

*Primary Examiner* — Jack Berman
*Assistant Examiner* — Meenakshi Sahu
(74) *Attorney, Agent, or Firm* — Foley & Lardner LLP

(57) ABSTRACT

Faster and better methods for leveling arrays including software and user interface for instruments. A method comprising: (i) providing at least one array of cantilevers supported by at least one support structure, (ii) providing at least one substrate, (iii) providing at least one instrument to control the position of the array with respect to the substrate, (iv) leveling the array with respect to the substrate, wherein the leveling is performed via a user interface on the instrument which is adapted to have the user input positional information from the motors and piezoelectric extender when at least one cantilever deflects from the substrate. Uniform z-displacements can be achieved.

83 Claims, 20 Drawing Sheets

U.S. PATENT DOCUMENTS

Figure 1:
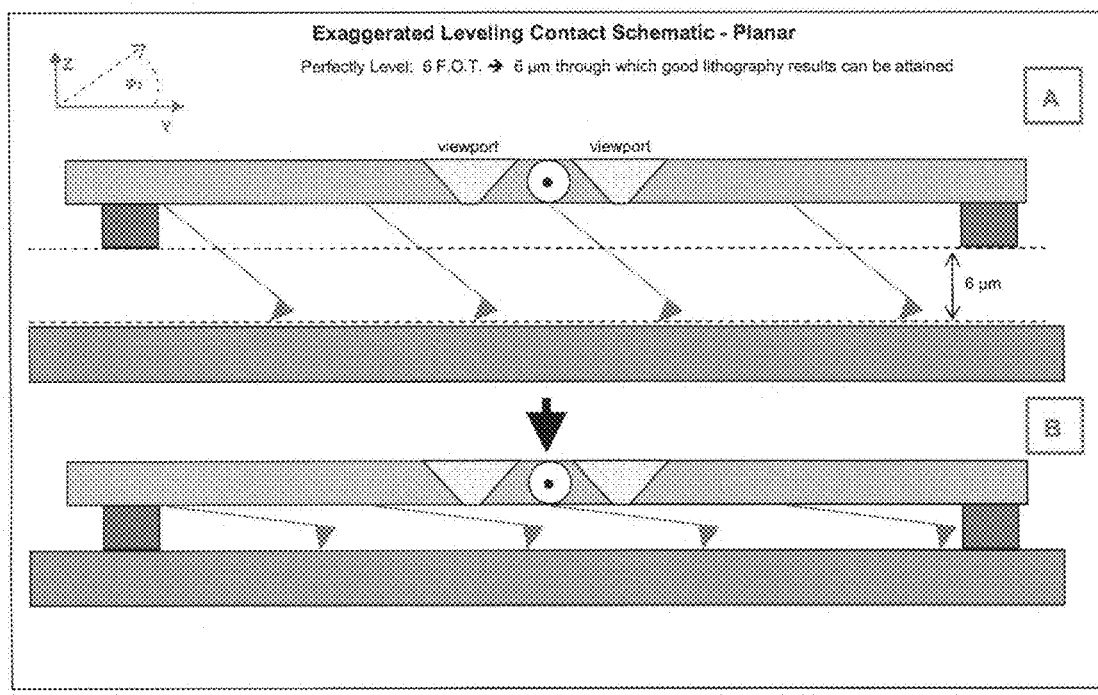

| | | | |
|---|---|---|---|
| 2003/0022470 A1* | 1/2003 | Liu et al. | 438/496 |
| 2003/0068446 A1 | 4/2003 | Mirkin et al. | |
| 2003/0162004 A1 | 8/2003 | Mirkin et al. | |
| 2003/0185967 A1 | 10/2003 | Eby et al. | |
| 2004/0008330 A1 | 1/2004 | Mirkin et al. | |
| 2004/0026681 A1 | 2/2004 | Cruchon-Dupeyrat et al. | |
| 2004/0101469 A1 | 5/2004 | Demers | |
| 2004/0175631 A1 | 9/2004 | Van Crocker et al. | |
| 2005/0035983 A1 | 2/2005 | Cruchon-Dupeyrat et al. | |
| 2005/0235869 A1 | 10/2005 | Cruchon-Dupeyrat et al. | |
| 2005/0255237 A1 | 11/2005 | Zhang et al. | |
| 2005/0272885 A1 | 12/2005 | Mirkin et al. | |
| 2006/0014001 A1 | 1/2006 | Mirkin et al. | |
| 2007/0087172 A1 | 4/2007 | Mirkin et al. | |

FOREIGN PATENT DOCUMENTS

| | | |
|---|---|---|
| WO | WO 00/41213 | 7/2000 |
| WO | WO 01/91855 | 12/2001 |
| WO | WO 02/080187 A | 10/2002 |
| WO | WO 2004/105046 | 12/2004 |
| WO | WO 2005/115630 | 12/2005 |
| WO | WO 2006/076302 A | 7/2006 |
| WO | WO 2007/126689 A | 11/2007 |
| WO | WO 2008/112713 A | 9/2008 |
| WO | WO 2009/020658 A | 2/2009 |

OTHER PUBLICATIONS

PCT/US2009/000728 filed Feb. 5, 2009, International Search Report & Written Opinion (19 pages).
Bottomley, "Scanning Probe Microscopy", *Anal. Chem.*, vol. 70, pp. 425R-475R (1998).
U.S. Appl. No. 10/307,515, filed Dec. 2, 2002, Mirkin et al.
U.S. Appl. No. 10/366,717, filed Feb. 14, 2003, Eby et al.
U.S. Appl. No. 10/375,060, filed Feb. 28, 2003, Dupeyrat et al.
U.S. Appl. No. 11/268,740, filed Dec. 8, 2005, Shile et al.
U.S. Appl. No. 11/690,738, filed Mar. 23, 2007, Mirkin et al.
U.S. Appl. No. 11/848,211, filed Aug. 30, 2007, Haaheim et al.
U.S. Appl. No. 12/073,909, filed Mar. 11, 2008, Haaheim et al.
U.S. Appl. No. 12/116,908, filed May 7, 2008, Rozhok et al.
U.S. Appl. No. 60/792,950, filed Apr. 19, 2006, Mirkin et al.
U.S. Appl. No. 60/894,657, filed Mar. 13, 2007, Haaheim.
U.S. Appl. No. 60/916,979, filed May 9, 2007, Amro et al.
U.S. Appl. No. 61/026,196, filed Feb. 5, 2008, Haaheim et al.
U.S. Appl. No. 61/147,448, filed Jan. 26, 2009, Amro.
U.S. Appl. No. 61/147,449, filed Jan. 26, 2009, Amro.
U.S. Appl. No. 61/147,451, filed Jan. 26, 2009, Amro.
U.S. Appl. No. 61/147,452, filed Jan. 26, 2009, Amro.
Ginger et al., "The Evolution of Dip-Pen Nanolithography," *Agnew. Chem. Int. Ed.*, vol. 43, pp. 30-45 (2004).
Huck, "Self-assembly meets nanofabrication: Recent developments in microcontact printing and dip-pen nanolithography," *Angewandte Chemie-International Edition*, vol. 46, pp. 2754-2757 (2007).
Huo et al., "Polymer Pen Lithography", Science, vol. 321, No. 5896, pp. 1658-1660 (2008).
Lenhert et al., "Massively Parallel Dip-Pen Nanolithography of Heterogeneous Supported Phospholipid Multilayer Patterns", *Small*, vol. 3, No. 1, p. 71-75 (2007).
Lenhert, "Materials integration by dip-pen nanolithography in Nanotechnology," *Nanoprobes*, vol. 2, WILEY-VCH, Weinheim, Berlin (2008).
Madou, *Fundamentals of Microfabrication*, $2^{nd}$ Ed., (2002).
Salaita et al., "Sub-100 nm, Centimeter-Scale, Parallel Dip-Pen Nanolithography", *Small*, vol. 10, pp. 940-945.
Pique and Chrisey (eds), *Direct-Write Technologies, Sensors, Electronics, and Integrated Power Sources*, (2002).
Rosner et al., "Dip pen nanolithography: Applications and functional extensions," *Dekker Encyclopedia of Nanoscience and Nanotechnology*, Taylor and Francis Group, New York (2005).
Salaita et al., "Applications of Dip-Pen Nanolithography," *Nature Nanotechnology*, Advanced On-line publication (11 pages) (2007).
Salaita et al., *Agnew. Chem. Int. Ed.*, vol. 45, pp. 7220-7223 (2006).
Van Zant, *Microchip Fabrication*, $5^{th}$ Ed., (2004).

* cited by examiner

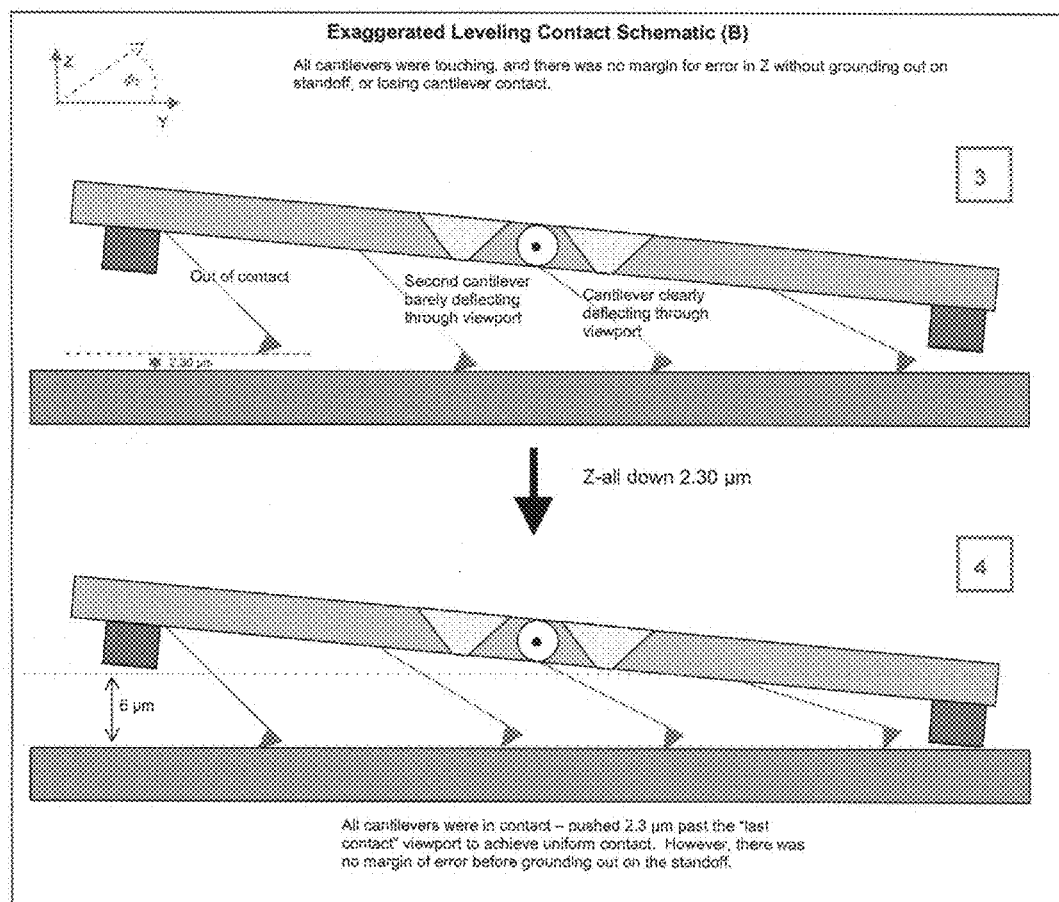

Figure 5
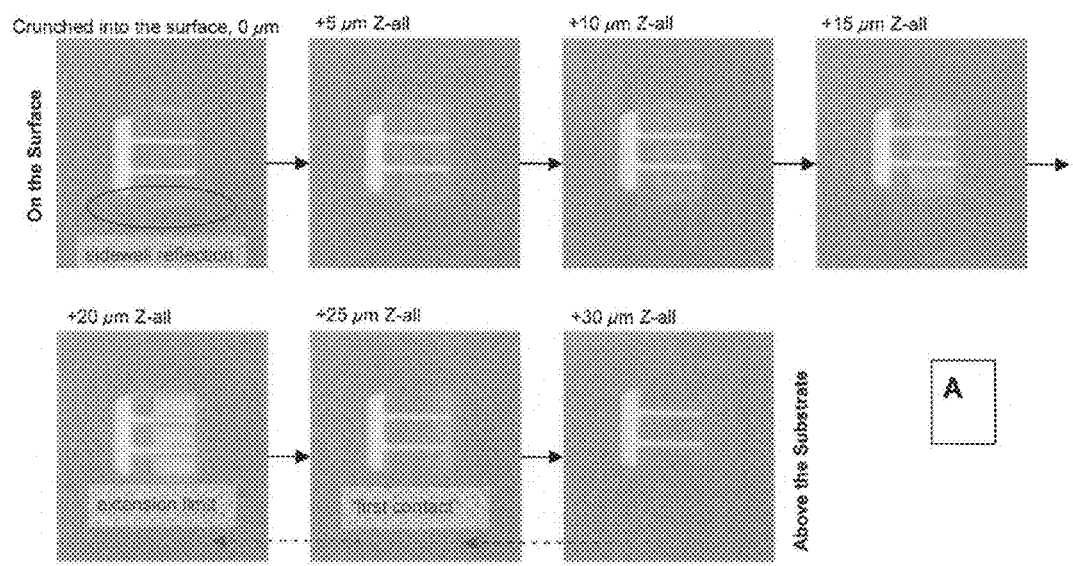
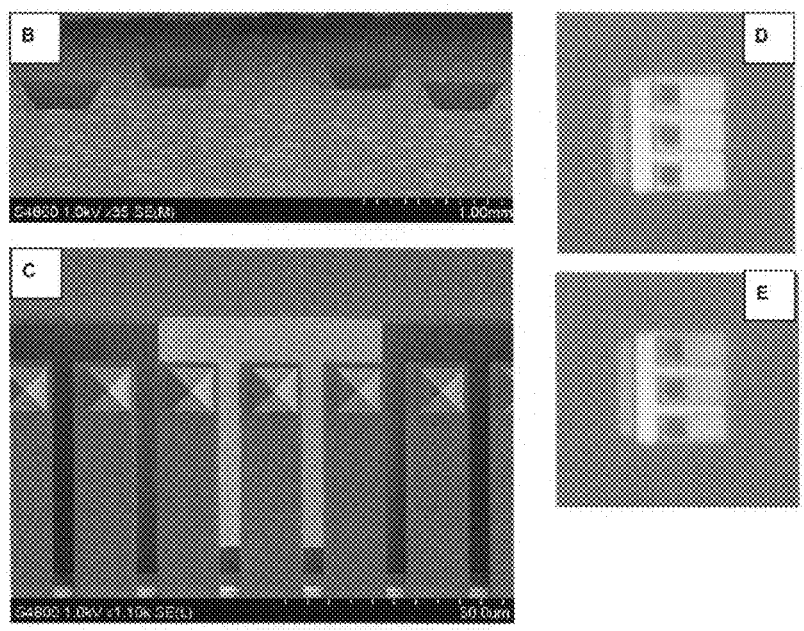

Figure 6
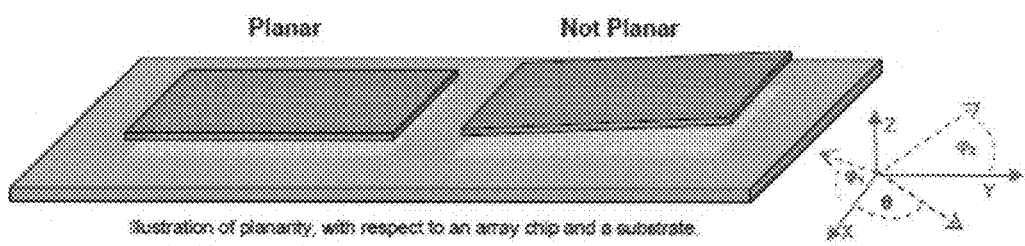
Illustration of planarity, with respect to an array chip and a substrate.
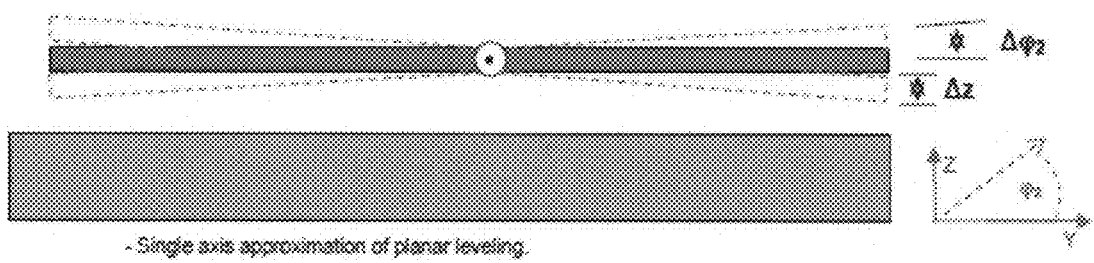
- Single axis approximation of planar leveling.

Figure 3:
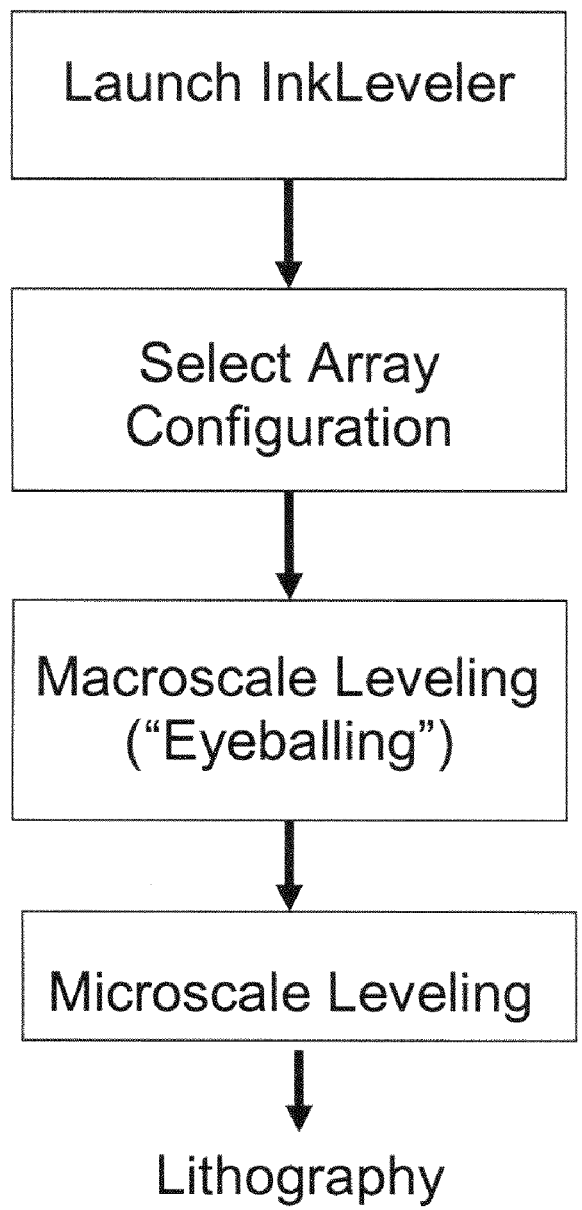

Figure 8
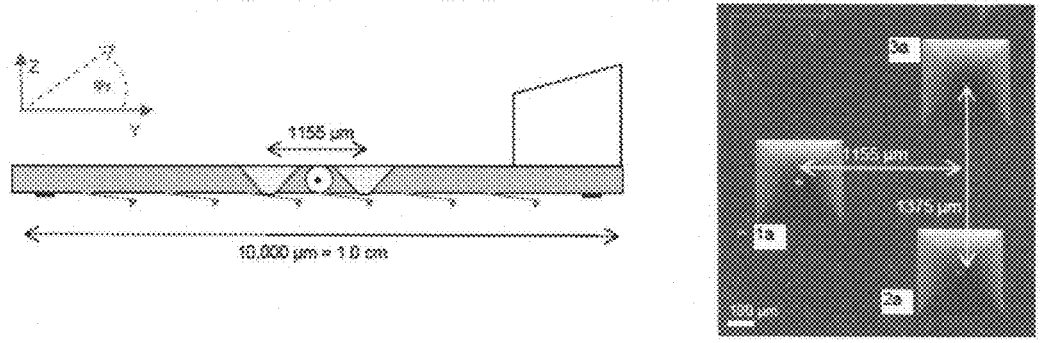
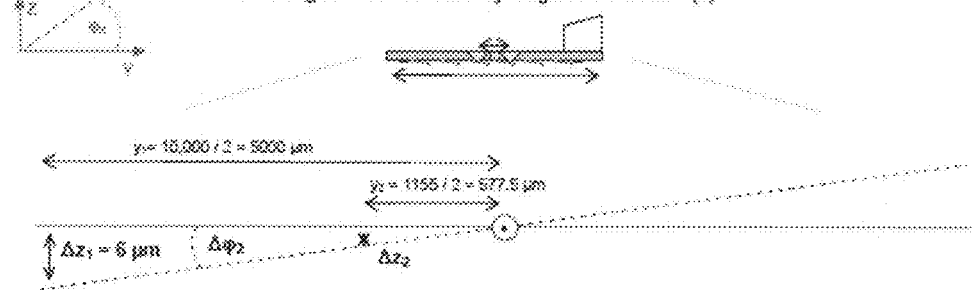
Fig. 3.2.4 – Derivation of 2D nano PrintArray angular tolerances.
According to basic trigonometry, for a 6 μm F.O.T.:
$$\tan \Delta \varphi_2 = \frac{\Delta z_1}{y_1} = \frac{\Delta z_2}{y_2} = \frac{6\,\mu m}{5000\,\mu m};$$
$$\Delta \varphi_2 = \tan^{-1}\left(\frac{6\,\mu m}{5000\,\mu m}\right) = 0.069°;$$
$$\Delta z_2 = y_2 \cdot \tan \Delta \varphi_2 = 577.5\,\mu m \cdot \tan(0.069°) = 0.70\,\mu m$$

Figure 14

| Viewport Touch-Down Lookup Table (partial) | | | | | |
|---|---|---|---|---|---|
| Measured F.O.T. for the array (μm) | If the Z-difference between the first and last touchdown vieports is ___ (μm). then... | Angular misalignment (planarity) (deg) | The "operational F.O.T." between the first and last touchdown tips of the array (μm) | Minimum amount past last touchdown viewport to achieve uniform contact (μm) | Margin of error before ground-out on standoff (μm), (after last touchdown viewport) |
| 6.0 | 0.00 | 0.000 (perfect) | NA | NA | 6.00 |
| 6.0 | 0.50 | 0.025° | 2.16 | 0.83 | 3.84 |
| 6.0 | 1.00 | 0.050° | 4.33 | 1.66 | 1.67 |
| 6.0 | 1.40 | 0.069° (max to maintain "level") | 6.00 | 2.30 | 0.00 |
| | | | | | |
| 20.0 | 0.00 | 0.000 (perfect) | NA | NA | 20.00 |
| 20.0 | 1.50 | 0.074° | 6.49 | 2.50 | 13.51 |
| 20.0 | 3.00 | 0.149° | 12.99 | 4.99 | 7.01 |
| 20.0 | 4.62 | 0.229° (max to maintain "level") | 20.0 | 7.69 | 0.00 |

Figure 16:
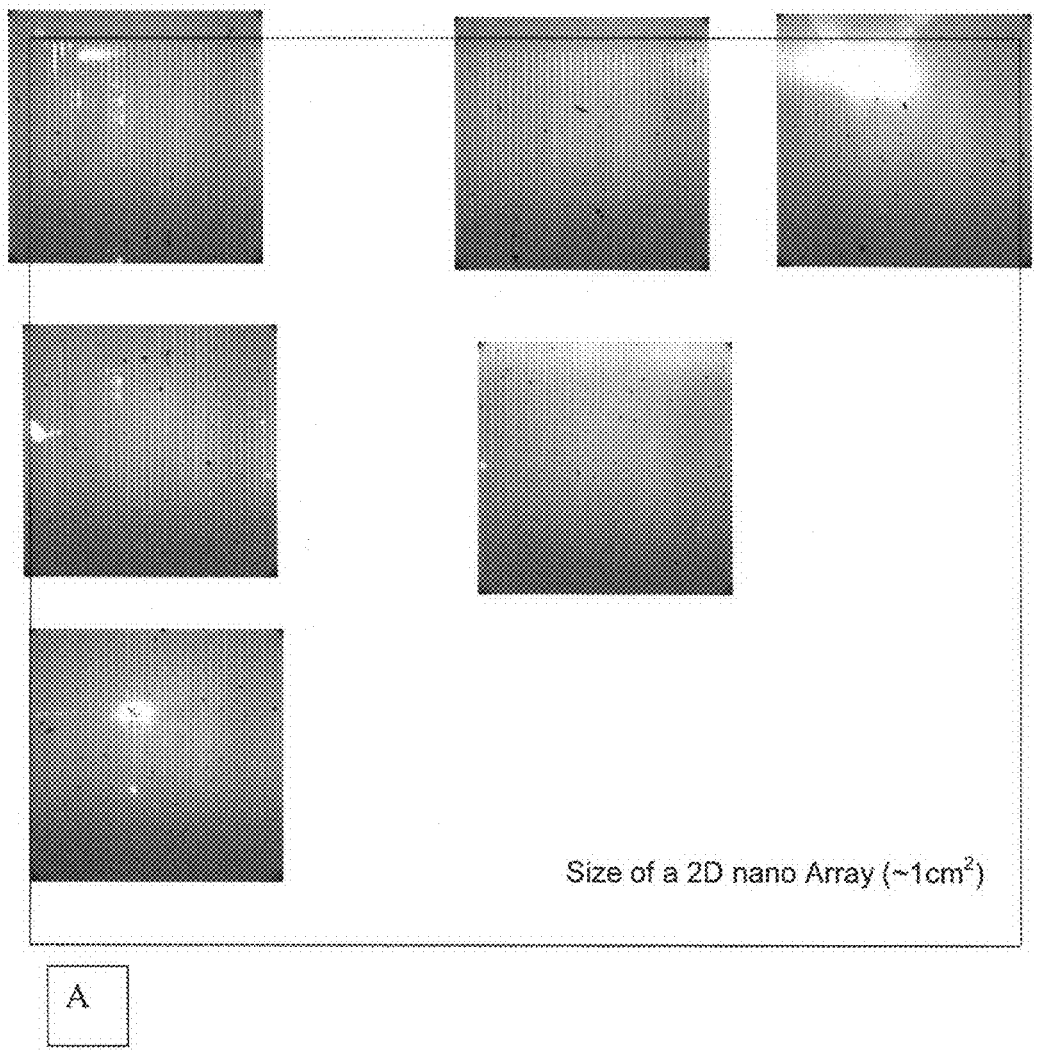

Continuation of Figure 16
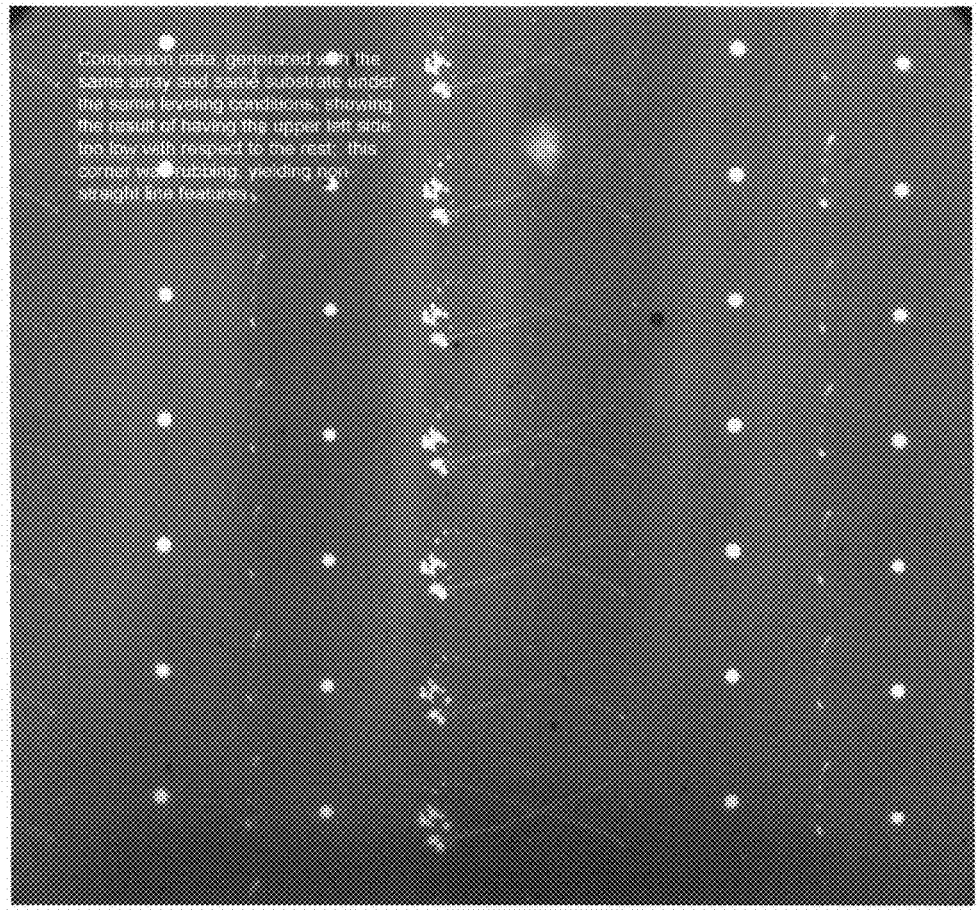
| B | Individual X' are 20 μm apart in X, and 90 μm apart in Y |

Figure 17:
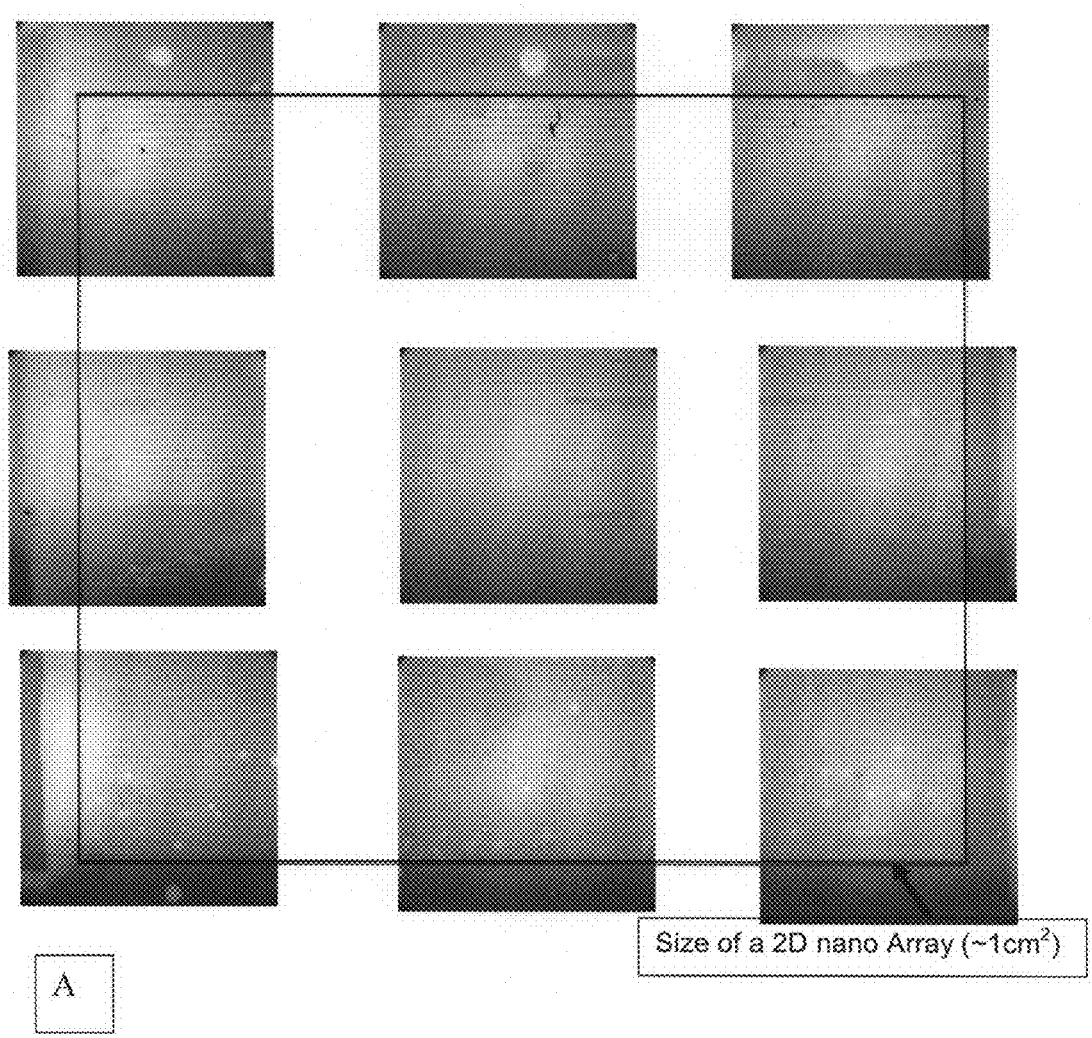

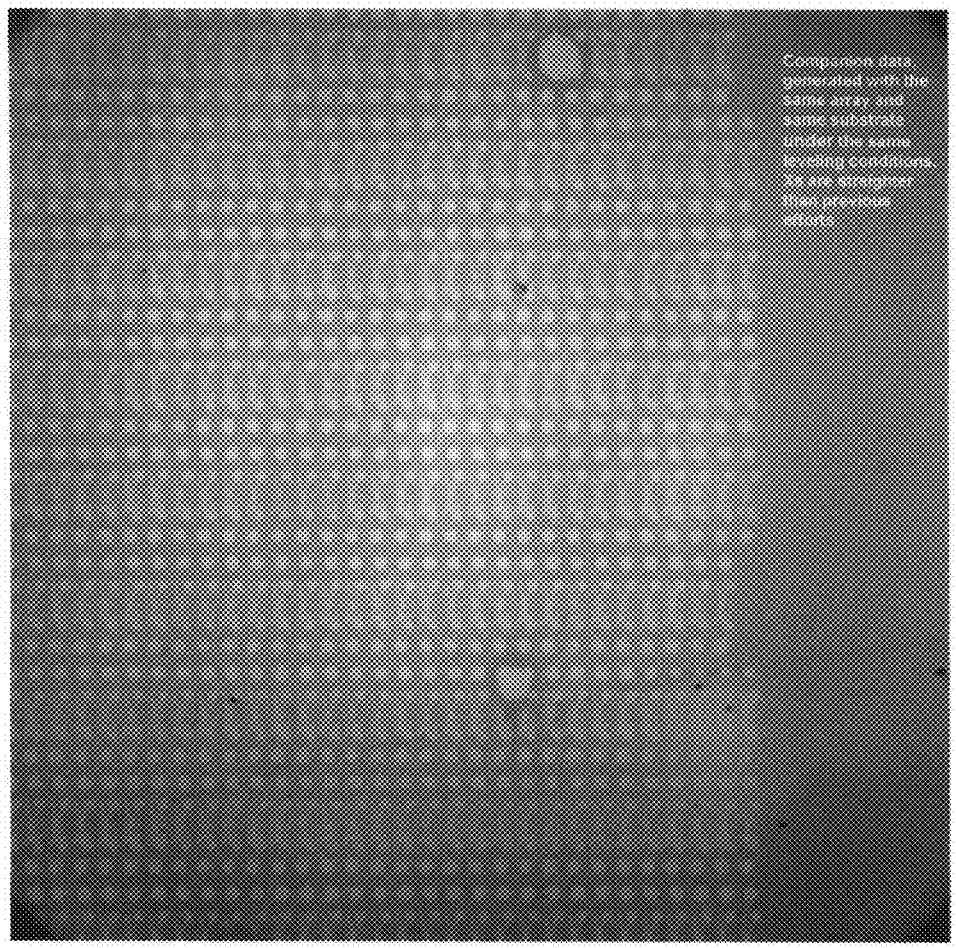
Continuation of Figure 17
| B | Individual X' are 20 μm apart in X, and 90 μm apart in Y |

ARRAY AND CANTILEVER ARRAY LEVELING

RELATED APPLICATIONS

This application claims priority to U.S. provisional application Ser. No. 61/026,196 filed Feb. 5, 2008 to Haaheim et al., which is hereby incorporated by reference in its entirety.

BACKGROUND

Sharp tips and nanoscale tips can be used for high resolution patterning, wherein an ink or patterning compound can be transferred from the tip to a solid surface. For example, the tip can be an atomic force microscope (AFM) tip attached to one end of a cantilever or a larger support structure. This direct write nanolithographic approach can provide advantages which competing nanolithographies may not provide including high registration and reasonable costs. The cantilever can be used in several embodiments including for example: (i) a single tip or cantilever, (ii) a linear array of tips or cantilevers, and (iii) a two-dimensional array of tips or cantilevers, e.g, multiple rows of linear arrays of tips or cantilevers. See, for example, Mirkin et al, WO 00/41213, WO 01/91855, *Small,* 2005, 10, 940-945; See also U.S. Pat. Nos. 7,005,378; 7,034,854; 7,060,977; 7,098,056; and 7,102,656; to NanoInk.

A need exists to improve these and related devices and methods. In particular, for example, a need exists for improvements which can be made to these methods, instruments, and devices, particularly as the tip density increases, cantilever embodiments become increasingly complex in a two-dimensional system, and as the processes are adapted to be commercial processes. For example, as the cantilever arrays become more geometrically complex and larger with more cantilevers, leveling of the array becomes more difficult. For example, if the method is not done properly, one tip may touch the surface before another second tip touches the surface, or the second tip may not even touch the surface. Or it may be difficult to know when the tips touch the surface. In many cases, it is desired that most or all of the tips are touching when writing, and most or all are off the surface when not writing. Once the two dimensional spatial profile of the array is established, it is desirable to have a high degree of planarity for the 2 D array of tips or cantilever tips; otherwise, during lithography cantilevers and tips can be damaged or writing may not occur at all. In particular, a need exists to provide a leveling means that is efficient and accurate. In some embodiments, a need exists to improve systems wherein the array may have a plurality of tips but the array does not employ cantilevers.

SUMMARY

Embodiments provided herein include, for example, instruments and devices, software, and methods of making and using the same.

For example, one embodiment is a method comprising: (i) providing at least one array of cantilevers supported by at least one support structure, (ii) providing at least one substrate, (iii) providing at least one instrument to control the position of the array with respect to the substrate, (iv) leveling the array with respect to the substrate, wherein the leveling is performed via a user interface on the instrument which is adapted to have the user input positional information from the motors and piezoelectric actuator when at least one cantilever deflects from the substrate.

One embodiment is a method comprising: (i) providing at least one array of cantilevers supported by at least one support structure, (ii) providing at least one substrate, (iii) providing at least one instrument to control the position of the array with respect to the substrate, (iv) leveling the array with respect to the substrate, wherein the leveling is performed via a user interface on the instrument which is adapted to have the user input positional information from the motors and piezoelectric extender when at least one cantilever deflects from the substrate.

Another embodiment is a method comprising: providing at least one array of cantilevers supported by at least one support structure comprising at least one viewport, providing at least one substrate, providing at least one instrument to control the position of the array with respect to the substrate, leveling the array with respect to the substrate, wherein the leveling is performed with the instrument comprising software further comprising a user interface adapted to provide operational control and iterative measurements of differences between the relative positions of the viewports with respect to the substrate.

Another embodiment provides a method comprising: providing at least one array of cantilevers, providing at least one substrate, providing at least one instrument to control the position of the array, leveling the array with respect to the substrate, wherein the instrument comprises at least one piezoelectric extender and at least three motors, wherein the piezoelectric extender and the motors are adapted to provide the leveling of the array.

Another embodiment provides a method comprising: providing at least one array of cantilevers comprising cantilever tips, providing at least one substrate, wherein the position of the array of cantilever tips with respect to the substrate is controlled by at least one z-piezoelectric extender and at least three z-axis motors in a triangular, surrounding relationship with respect to the array, wherein the z-axis motors are adapted to raise and lower the cantilever tips with respect to the substrate, adjusting the z-axis motors until all the cantilever tips are substantially level with respect to the substrate to an unaided eye, positioning the array so that the cantilevers deflect by a non-negligible amount while fully extending the z-piezoelectric extender, adjusting the z-piezoelectric extender to determine the relative position of the z-axis motors, and recording the positions for future calibration reference so that the method needs to be performed once.

Another embodiment provides a method comprising: providing at least one surface with topographical features, providing at least one substrate, providing at least one instrument to control the position of the features, leveling the array with respect to the substrate, wherein the instrument is adapted to provide leveling of the surface by a software routine adapted to provide iterative measurements of the positions of the array.

Another embodiment provides a method of leveling comprising: providing at least one surface with topographical features, providing at least one substrate, providing at least one instrument to control the spatial position of the array, leveling the array with respect to the substrate, wherein the instrument comprises at least one piezoelectric extender and at least three motors adapted to provide the leveling of the array.

Another embodiment provides a method comprising: providing at least one surface with topographical features, providing a substrate, wherein the position of the features with respect to the substrate is controlled by at least one piezoelectric extender and at least three motors in a triangular, surrounding relationship with respect to the surface, wherein the motors are adapted to raise and lower the features with respect to the substrate, adjusting the motors until all the features are substantially level with respect to the substrate to an unaided eye, positioning the array so that the surface features touch the substrate by a non negligible amount, adjusting the piezoelectric extender to determine the relative position of the motors, and recording the positions for future calibration references so that the method needs to be performed once.

Another embodiment provides a software routine comprising a user interface, wherein the routine prompts a user to perform measurements and input measurement results via the interface, the routine performs calculations based on the results and controls and monitors at least one piezoelectric extender and at least three motors to provide leveling of a device with respect of a substrate.

Another embodiment provides a software routine comprising a user interface, wherein the routine can be adapted to perform automated measurements and iterative calculations and controls and monitors at least one piezoelectric extender and at least three motors to provide leveling of a device with respect of a substrate.

Another embodiment provides a method comprising: providing at least one array of cantilevers supported by at least one support structure, providing at least one substrate, providing at least one instrument comprising motors to control the position of the array with respect to the substrate, leveling the array with respect to the substrate, wherein the leveling step is carried out via a user interface on the instrument which is adapted to have the user input positional information for the motors when at least one cantilever deflects from the substrate.

Another embodiment is a method comprising: (i) providing at least one array of tips, (ii) providing at least one substrate, (iii) providing at least one instrument to control the position of the array of tips with respect to the substrate, (iv) leveling the array with respect to the substrate, wherein the leveling is performed via a user interface on the instrument which is adapted to have the user input positional information from the motors and piezoelectric actuator when at least one tip contacts the substrate. The tips can be nanoscopic tips, scanning probe microscope tips, polymer tips, or atomic force microscope tips.

Another embodiment provides a method comprising: providing at least one array of nanoscopic tips supported by at least one support structure, providing at least one substrate, providing at least three points of reference in X-Y plane with respect to the substrate to determine points of contact between tips and substrate, providing at least one instrument comprising motors and a piezoelectric extender to control the position of the array with respect to the substrate, leveling the array with respect to the substrate, wherein the leveling is carried out via a user interface on the instrument which is adapted to have a user input positional information from the motors and piezoelectric extender when at least one nanoscopic tip contacts the surface.

At least one advantage from at least one embodiment can be faster leveling time.

At least one additional advantage from at least one embodiment can be better leveling results.

At least one additional advantage from at least one embodiment can be better patterning results.

At least one additional advantage from at least one embodiment is tighter tolerances, which can lead to larger array of tips.

At least one additional advantage from at least one embodiment is uniform z-displacements can be achieved.

At least one additional advantage from at least one embodiment can be a more quantitative understanding of leveling before patterning.

At least one additional advantage from at least one embodiment can be ability to make rapid corrections. This can provide the ability to, for example, flexibly work with multiple substrates, whether in serial or parallel manner.

BRIEF DESCRIPTIONS OF FIGURES

FIG. 1. A Schematic showing a perfectly planar 2 D nano PrintArray at the initial point of contact, and after 6 μm of deflection grounding out on the standoffs. In this embodiment, the F.O.T. was 6 μm.

Figure 2:
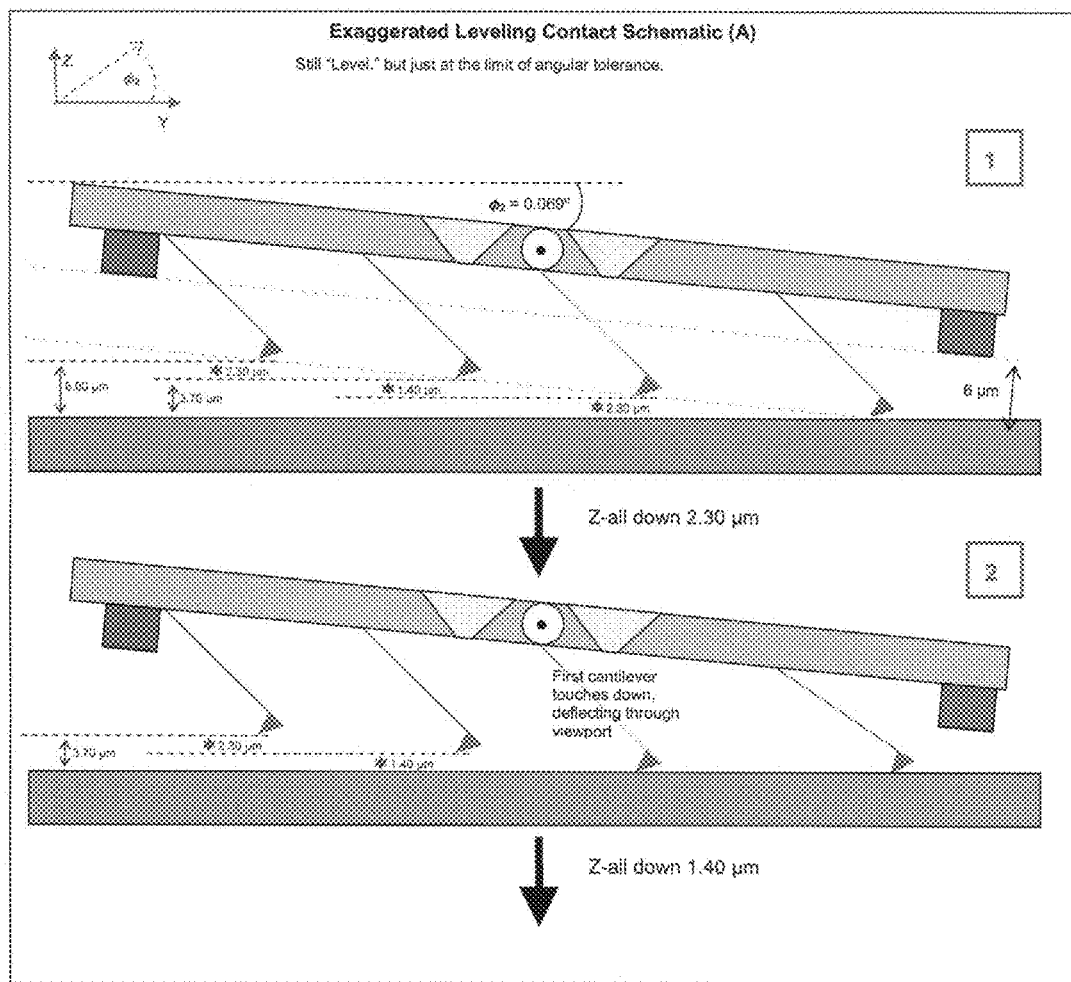

FIG. 2. A schematic of a scenario where the 2 D nano PrintArray approaches the limit of angular tolerance.

FIG. 3. A flowchart illustrating the steps of leveling using NSCRIPTOR.

Figure 4:
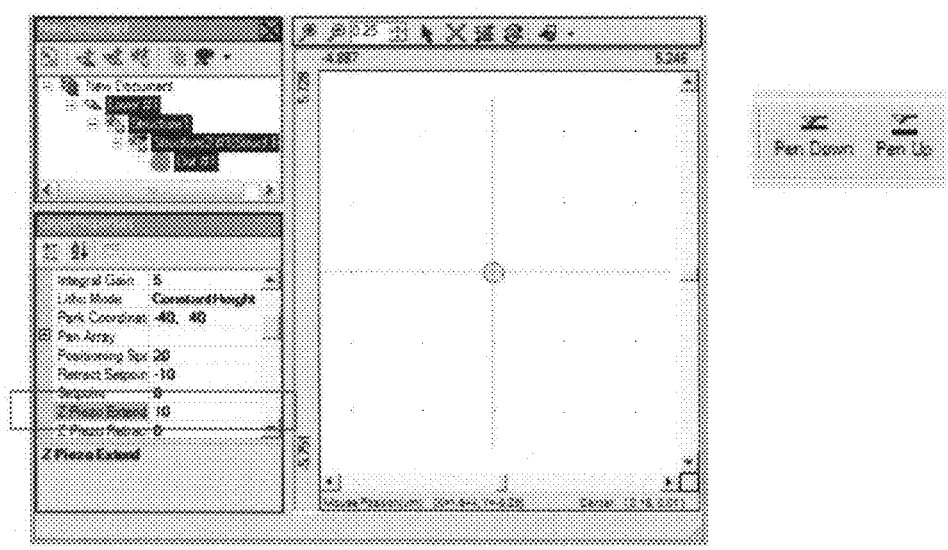

FIG. 4. INKCAD display of the z-piezoelectric extender, actuator, sensor ("z-piezo") extension and retraction values and the icons in InkFinder.

FIG. 5. (A) Mapping the visual progression of cantilever deflection for a single viewport. The array was first overdriven into the surface, and then deflection was monitored as the array was retracted. This provides a visual reference so that thereafter there is no need to extend more than 5 μm beyond the "first contact" point; (B) SEM top angled view of the etched viewports; (C) SEM view from the underside showing three cantilevers in front of the viewport aperture; with the device mounted on the NSCRIPTOR scanner, the NSCRIPTOR optics was used to observed the cantilevers through the viewport both (D) before the tips touch the gold surface, and (E) after contact is made.

FIG. 6. An illustration of planarity, with respect to an array chip and a substrate, and the parameters used to define thereof.

Figure 7:
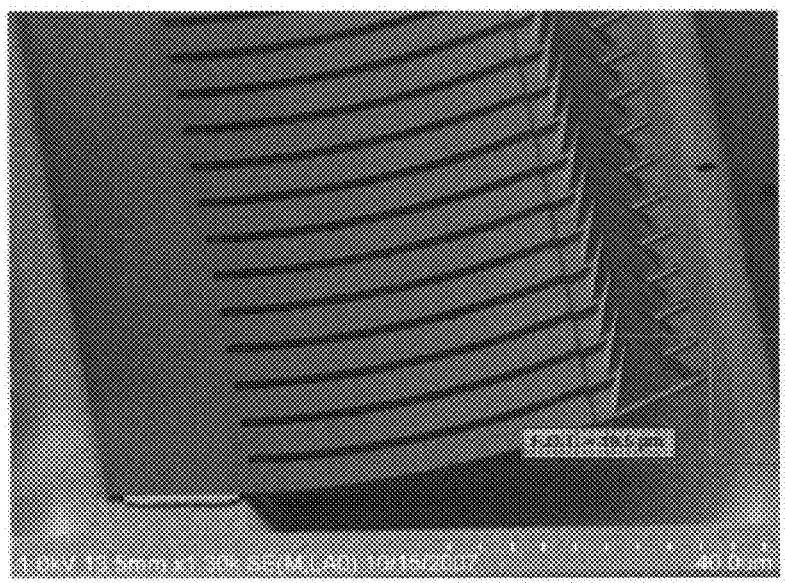

FIG. 7. A SEM image of a 2 D nano PrintArray with a F.O.T of 19.5 μm and the array shows significant "bowing."

FIG. 8. Viewport configuration with respect to pivot point and total array size and an example of the estimation of the parameters used to defined planarity.

Figure 9:
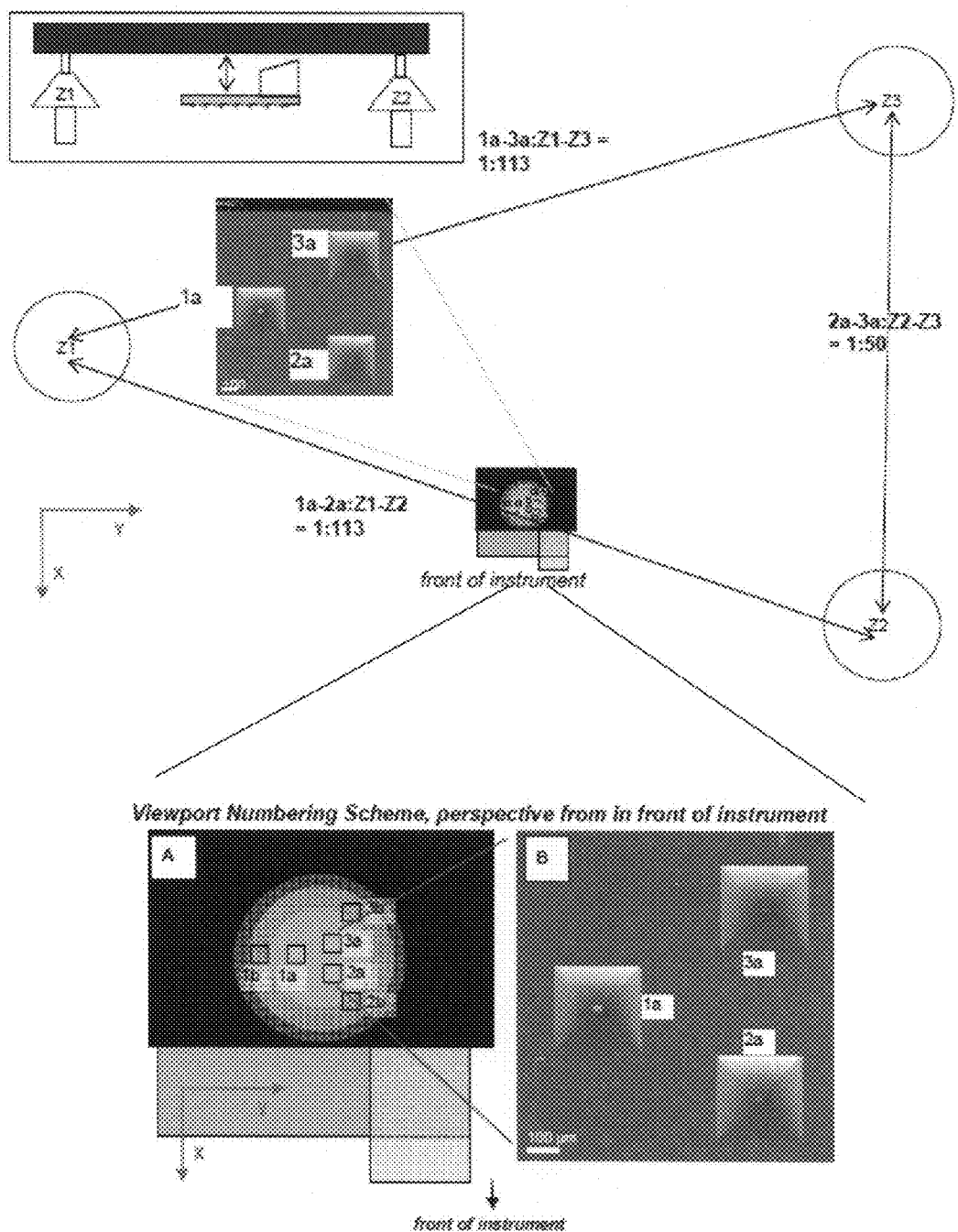

FIG. 9. Simplified calculations of the approximated ratios for the correction of the z-difference between viewports.

Figure 10:
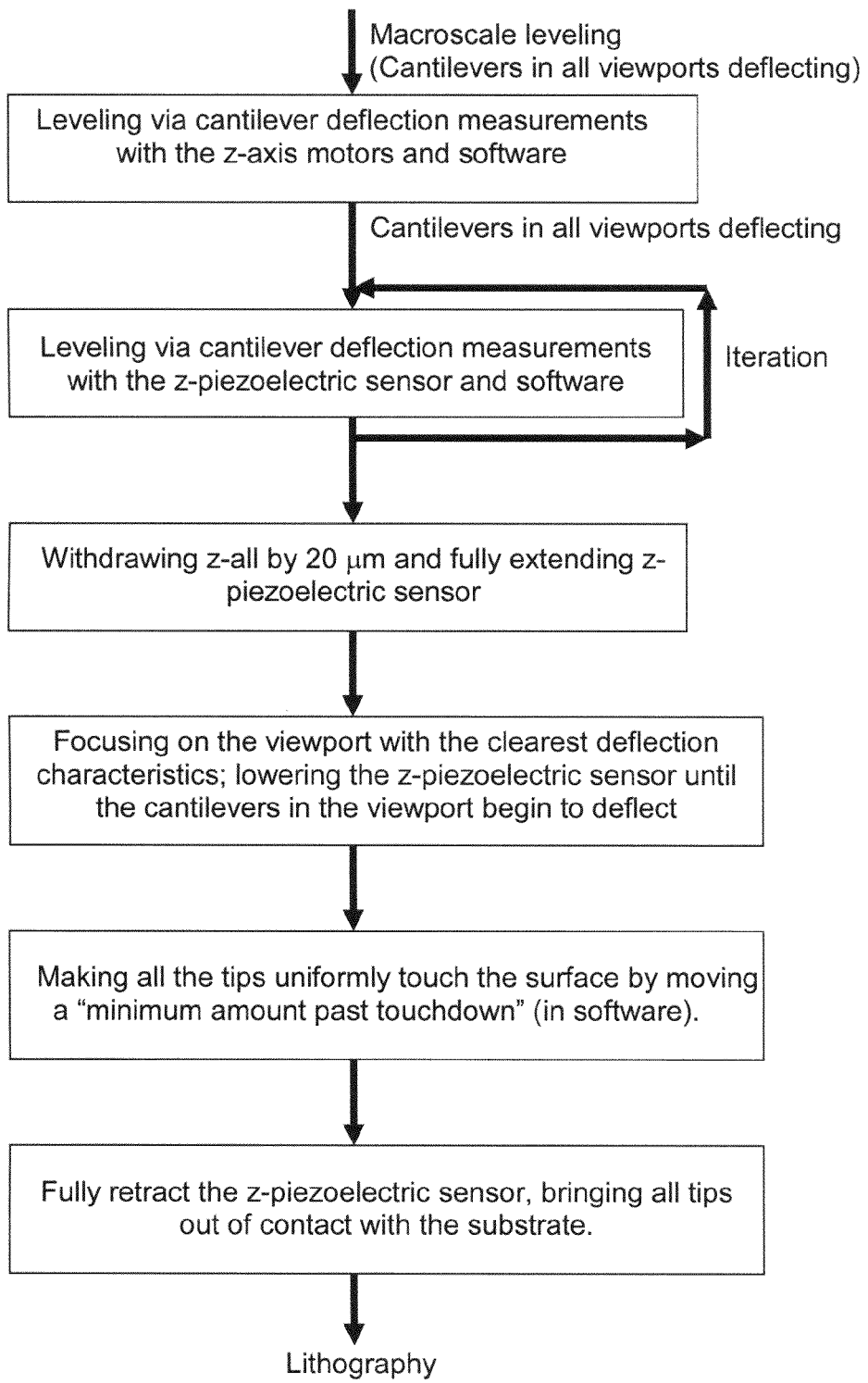

FIG. 10. A flowchart illustrating the steps of microscale leveling using the INKLEVELER including use of piezoelectric extender, actuator, or sensor.

Figure 11:
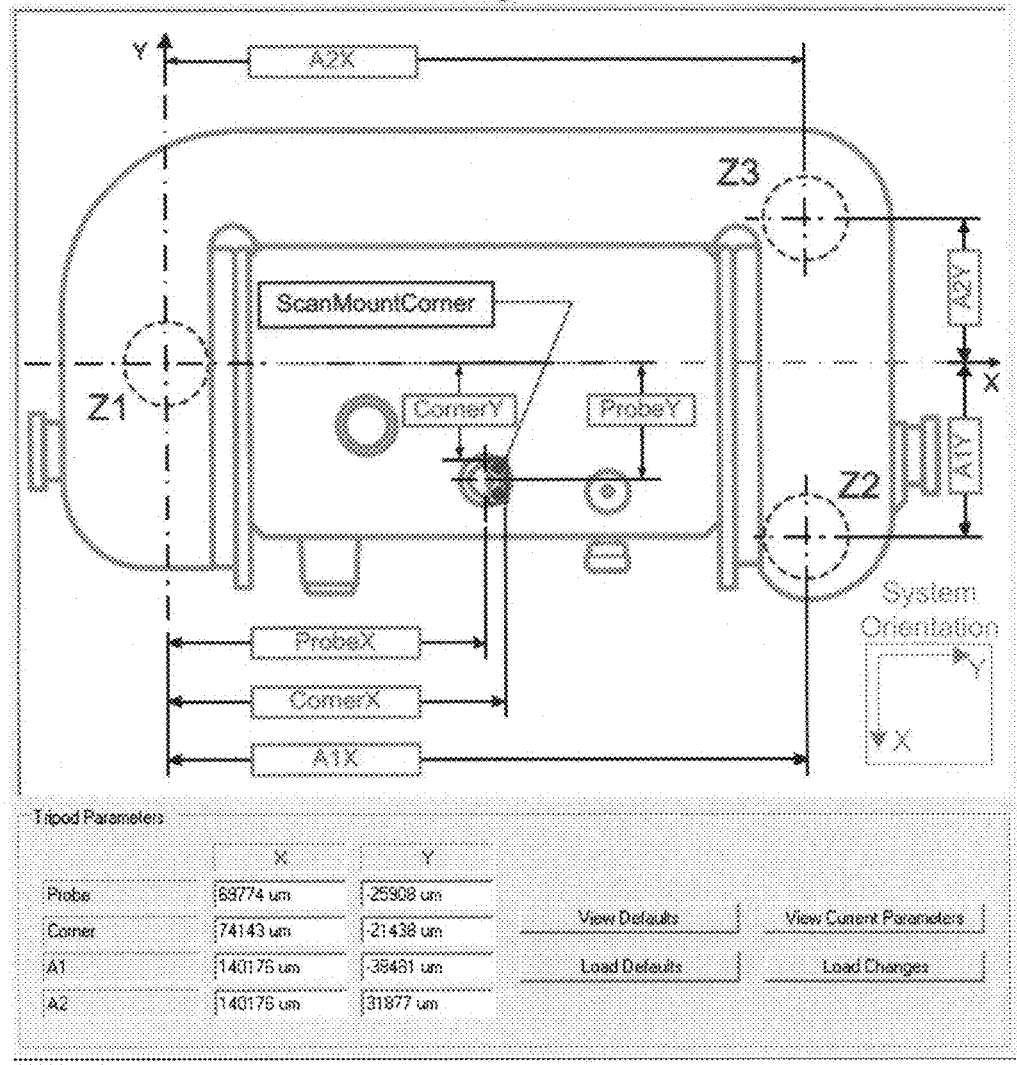

FIG. 11. Display of the default configurations and blueprint of the hardware.

Figure 12:
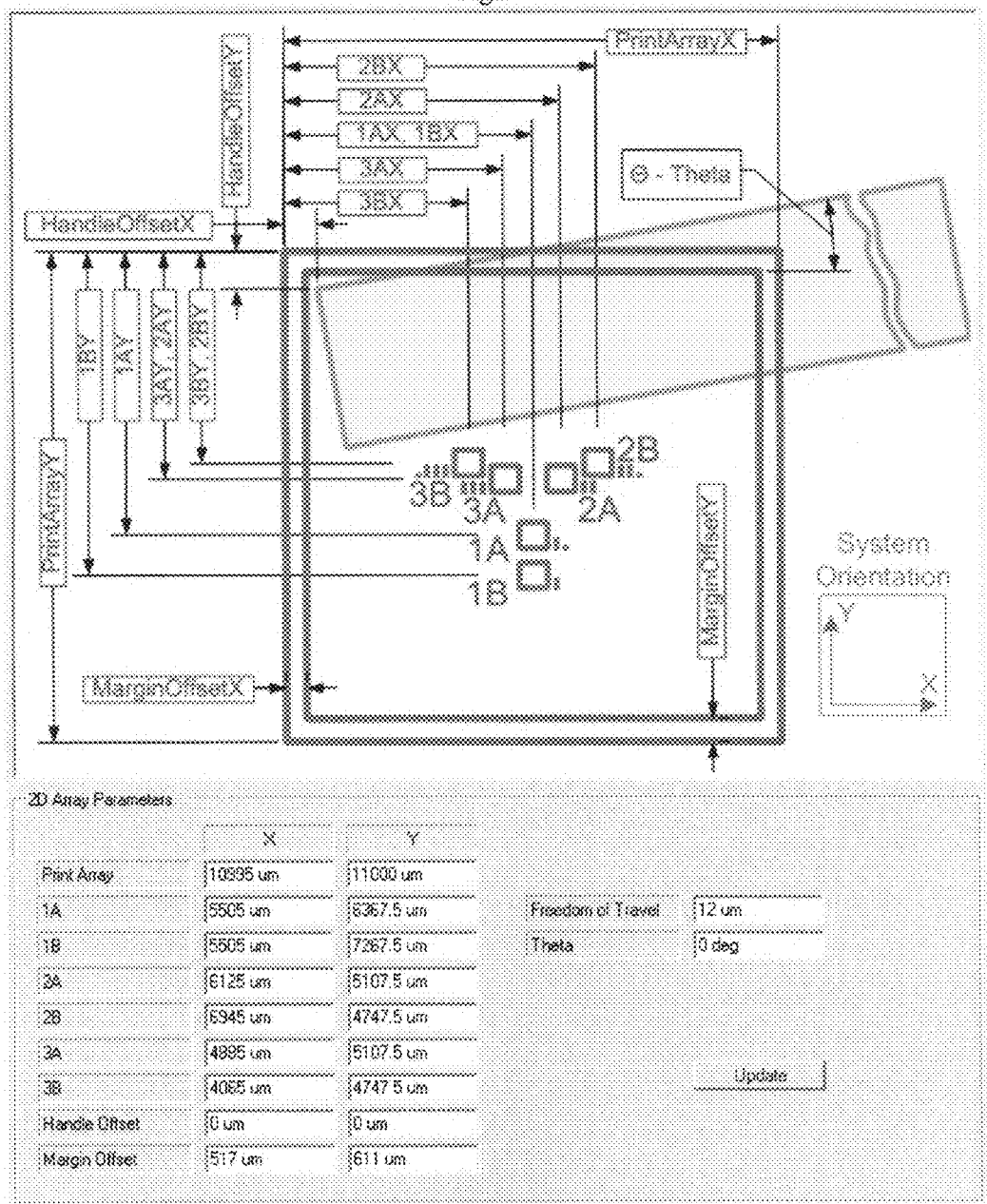

FIG. 12. Display of the default configurations and blueprint of the 2 D nano PrintArray device.

Figure 13:
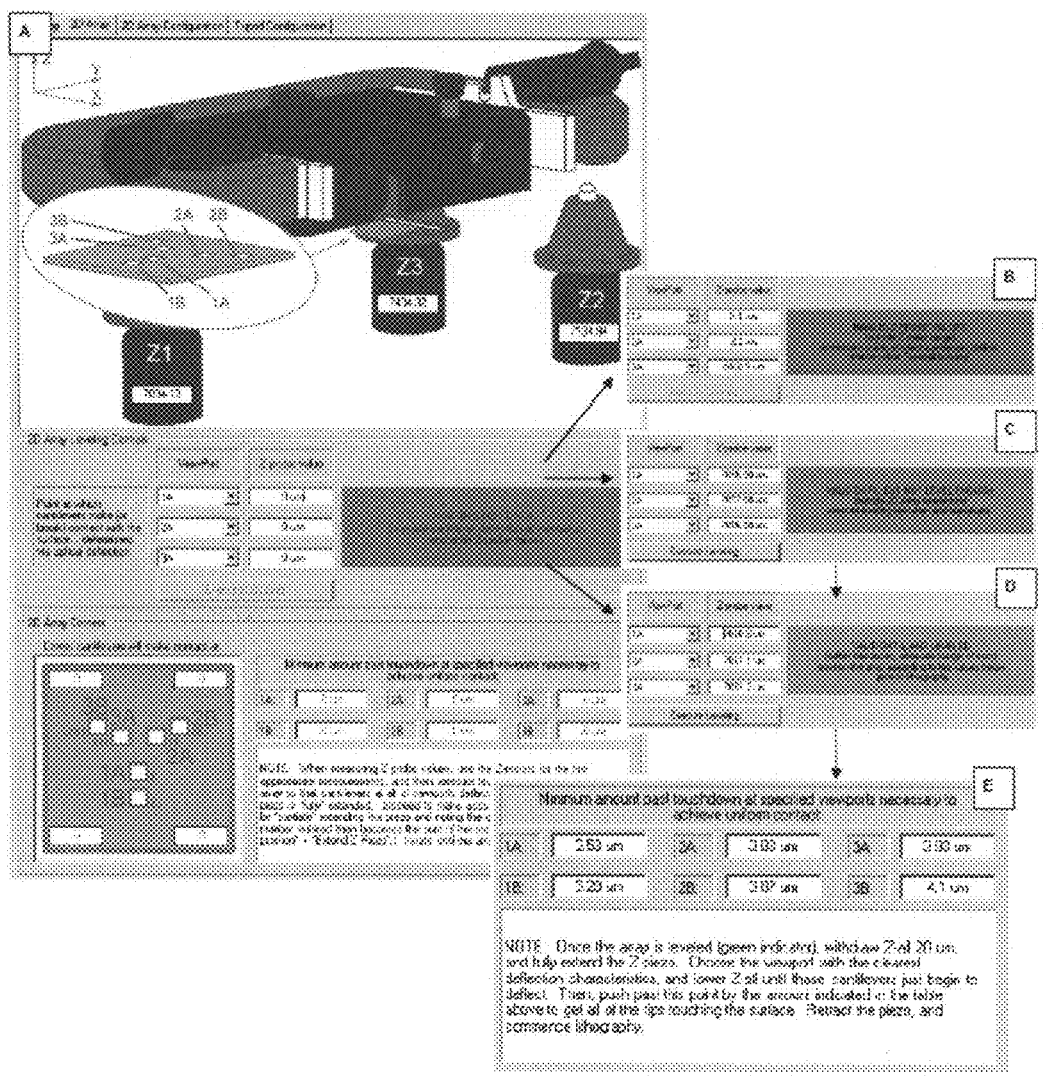

FIG. 13. Display of the main 2 D leveling software interface: (A) as it appears by default, waiting for user input; (B) the user has entered invalid z-probe input, with the "execute leveling" button remaining disabled; (C) the user has entered valid data, but the array requires further leveling—"execute leveling" button is enabled; (D) the entered z-probe values indicate the array is level, and the user can either execute leveling again; or (E) proceed to the "minimum amount past touchdown" table, which then appears and populated with real data.

FIG. 14. A table providing some examples of viewport touch-down data.

Figure 15:
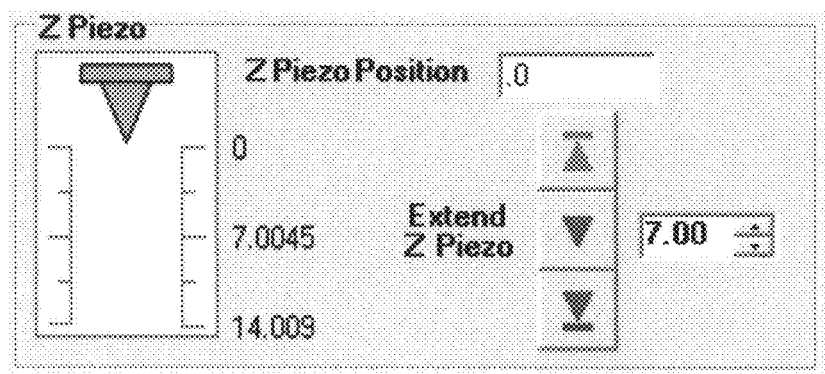

FIG. 15. Display of the interactive manual z-piezo control, allowing the user to control the z-piezo position.

FIG. 16. Optical micrograph of patterning result with unleveled array of cantilever tips.

FIG. 17. Optical micrograph of patterning result with array of cantilever tips after the array was leveled by leveling technique described in the presently claimed invention.

DETAILED DESCRIPTION

Introduction

All references cited herein are hereby incorporated by reference in their entirety.

Priority U.S. provisional application Ser. No. 61/026,196 filed Feb. 5, 2008 to Haaheim et al. is hereby incorporated by reference in its entirety.

Two-dimensional pen arrays, including methods of making, are described in for example U.S. provisional application 60/792,950 filed Apr. 19, 2006 to Mirkin et al., which is hereby incorporated by reference in its entirety including figures, claims, and working examples. See also the present specification, FIGS. 3-5 for related devices and methods. See also Salaita et al., *Angew. Chem. Int. Ed.*, 2006, 45, 7220-7223; Lenhert et al., *Small*, 2007, 3 (1), 71-75, which are hereby incorporated by reference in their entirety. In some of the embodiments, the 2 D array can be called "2 D nano PrintArray."

For practice of the various embodiments described herein, lithography, microlithography, and nanolithography instruments, pen arrays, active pens, passive pens, inks, patterning compounds, kits, ink delivery, software, and accessories for direct-write printing and patterning can be obtained from NanoInk, Inc., Chicago, Ill. Instrumentation includes the NSCRIPTOR. Software includes INKCAD software (NanoInk, Chicago, Ill.), providing user interface for lithography design and control. E-Chamber can be used for environmental control. Dip Pen Nanolithography™ and DPN™ are trademarks of NanoInk, Inc.

The following patents and co-pending applications related to direct-write printing with use of cantilevers, tips, and patterning compounds are hereby incorporated by reference in their entirety and can be used in the practice of the various embodiments described herein, including inks, patterning compounds, software, ink delivery devices, and the like:

1. U.S. Pat. No. 6,635,311 to Mirkin et al., which describes fundamental aspects of DPN printing including inks, tips, substrates, and other instrumentation parameters and patterning methods;
2. U.S. Pat. No. 6,827,979 to Mirkin et al., which further describes fundamental aspects of DPN printing including software control, etching procedures, nanoplotters, and complex and combinatorial array formation.
3. U.S. patent publication number 2002/0122873 A1 published Sep. 5, 2002 ("Nanolithography Methods and Products Produced Therefor and Produced Thereby"), which describes aperture embodiments and driving force embodiments of DPN printing.
4. U.S. regular patent application, Ser. No. 10/366,717 to Eby et al., filed Feb. 14, 2003 ("Methods and Apparatus for Aligning Patterns on a Substrate"), which describes alignment methods for DPN printing (published Oct. 2, 2003 as 2003/0185967).
5. U.S. regular patent application, Ser. No. 10/375,060 to Dupeyrat et al., filed Feb. 28, 2003 ("Nanolithographic Calibration Methods"), which describes calibration methods for DPN printing.
6. U.S. Patent Publication 2003/0068446, published Apr. 10, 2003 to Mirkin et al. ("Protein and Peptide Nanoarrays"), which describes nanoarrays of proteins and peptides;
7. U.S. Regular Patent Application, Ser. No. 10/307,515 filed Dec. 2, 2002 to Mirkin et al. ("Direct-Write Nanolithographic Deposition of Nucleic Acids from Nanoscopic Tips"), which describes nucleic acid patterning (PCT/US2002/038252 published Jun. 12, 2003).
8. U.S. Regular Patent Application, Ser. No. 10/320,721 filed Dec. 17, 2002 to Mirkin et al. ("Patterning of Solid State Features by Direct-Write Nanolithographic Printing"), which describes reactive patterning and sol gel inks (now published Aug. 28, 2003 as 2003/0162004).
9. U.S. Pat. Nos. 6,642,129 and 6,867,443 to Liu et al. ("Parallel, Individually Addressable Probes for Nanolithography"), describing active pen arrays.
10. U.S. Patent Publication 2003/0007242, published Jan. 9, 2003 to Schwartz ("Enhanced Scanning Probe Microscope and Nanolithographic Methods Using Same").
11. U.S. Patent Publication 2003/0005755, published Jan. 9, 2003 to Schwartz ("Enhanced Scanning Probe Microscope").
12. U.S. patent application Ser. No. 10/637,641 filed Aug. 11, 2003, now published as 2004/0101469, describing catalyst nanostructures and carbon nanotube applications.
13. U.S. patent application Ser. No. 10/444,061 filed May 23, 2003, now published as 2004/0026681 published Feb. 12, 2004, and US patent publication 2004/0008330 published Jan. 15, 2004, describing printing of proteins and conducting polymers respectively.
14. U.S. patent application Ser. No. 10/647,430 filed Aug. 26, 2003, now U.S. Pat. No. 7,005,378, describing conductive materials as patterning compounds.
15. U.S. patent application Ser. No. 10/689,547 filed Oct. 21, 2003, now published as 2004/0175631 on Sep. 9, 2004, describing mask applications including photomask repair.
16. U.S. patent application Ser. No. 10/705,776 filed Nov. 12, 2003, now published as 2005/0035983 on Feb. 17, 2005, describing microfluidics and ink delivery.
17. U.S. patent application Ser. No. 10/788,414 filed Mar. 1, 2004, now published as 2005/0009206 on Jan. 13, 2005 describing printing of peptides and proteins.
18. U.S. patent application Ser. No. 10/893,543 filed Jul. 19, 2004, now published as 2005/0272885 on Dec. 8, 2005, describing ROMP methods and combinatorial arrays.
19. U.S. patent application Ser. No. 11/056,391 filed Feb. 14, 2005, now published as 2005/0255237 published on Nov. 17, 2005, describing stamp tip or polymer coated tip applications.
20. U.S. patent application Ser. No. 11/065,694 filed Feb. 25, 2005, now published as 2005/0235869 on Oct. 27, 2005, describing tipless cantilevers and flat panel display applications.
21. US Patent publication 2006/001,4001 published Jan. 19, 2006 describing etching of nanostructures made by DPN methods.
22. WO 2004/105046 to Liu & Mirkin published Dec. 2, 2004 describes scanning probes for contact printing.
23. U.S. patent application "Active Pen Nanolithography," Ser. No. 11/268,740 to Shile et al. filed Nov. 8, 2005 describes for example thermocompression bonding and silicon handle wafers.

Embodiments described in U.S. patent application Ser. No. 11/848,211 filed Aug. 30, 2007 for "USING OPTICAL DEFLECTION OF CANTILEVERS FOR ALIGNMENT" can be used.

In addition, the following US provisional applications filed Jan. 26, 2009, can be used in practice of embodiments described herein, including, for example, 61/147,448; 61/147,449; 61/147,451; and 61/147,452, including methods of coating tips, methods of and devices for leveling, methods of controlling the substrate, and biological applications of arrays prepared by methods described herein.

DPN methods are also described in Ginger et al., "The Evolution of Dip-Pen Nanolithography," *Angew. Chem. Int. Ed.* 2004, 43, 30-45, including description of high-throughput parallel methods. See also Salaita et al., "Applications of Dip-Pen Nanolithography," *Nature Nanotechnology,* 2007, Advanced On-line publication (11 pages); Rosner et., "Dip pen nanolithography: Applications and functional extensions," *Dekker Encyclopedia of Nanoscience and Nanotechnology,*" Taylor and Francis Group, New York, 2005; Huck, "Self-assembly meets nanofabrication: Recent developments in microcontact printing and dip-pen nanolithography," *Angewandte Chemie-International Edition* 46, 2754-2757, 2007; and Lenhert, "Materials integration by dip-pen nanolithography in Nanotechnology", *Nanoprobes*, Vol. 2, WILEY-VCH Weinheim, Berlin, 2008.

Direct write methods, including DPN printing and pattern transfer methods, are described in for example *Direct-Write Technologies, Sensors, Electronics, and Integrated Power Sources*, Pique and Chrisey (Eds), 2002.

The direct-write nanolithography instruments and methods described herein are particularly of interest for use in preparing bioarrays, nanoarrays, and microarrays based on peptides, proteins, nucleic acids, DNA, RNA, viruses, biomolecules, and the like. See, for example, U.S. Pat. No. 6,787,313 for mass fabrication of chips and libraries; U.S. Pat. No. 5,443,791 for automated molecular biology laboratory with pipette tips; U.S. Pat. No. 5,981,733 for apparatus for the automated synthesis of molecular arrays in pharmaceutical applications. Combinatorial arrays can be prepared. See also, for example, U.S. Pat. Nos. 7,008,769; 6,573,369; and 6,998,228 to Henderson et al.

Scanning probe microscopy is reviewed in Bottomley, *Anal. Chem.,* 1998, 70, 425R-475R. Also, scanning probe microscopes are known in the art including probe exchange mechanisms as described in, for example, U.S. Pat. No. 5,705,814 (Digital Instruments).

Microfabrication methods are described in for example Madou, *Fundamentals of Microfabrication, 2$^{nd}$ Ed.,* 2002, and also Van Zant, *Microchip Fabrication, 5$^{th}$ Ed.,* 2004.

Instrument

Instruments capable of nanopositioning and using piezoelectric extenders, actuators, and/or sensors are known in the art. The instrument can be for example an AFM instrument modified for dip pen nanolithography, or alternatively, a similar instrument adapted directly to do dip pen nanolithography. Instrument can be obtained for example from NanoInk (Skokie, Ill.) including for example an NSCRIPTOR™.

In some embodiments, the instrument comprises at least one z-axis piezoelectric extender, actuator, or sensor and at least three z-axis motors, both of which can be controlled and monitored by a software routine that allows a user to input positional information via a user interface. An example of the instruments is described in the U.S. provisional application 60/916,979 filed May 9, 2007 to Amro et al. (see also, US regular application, "Compact Nanofabrication Apparatus," Ser. No. 12/116,908 filed May 7, 2008).

Instruments, arrays of tips, and tips can be adapted to have or to not have cantilevers. For example, a cantilever free system of an array of tips is described in, for example, Huo et al., *Science*, Sep. 19, 2008, vol. 321, no. 5896, 1658-1660, which is hereby incorporated by reference.

Support Structure

The support structure can be adapted to support tips, cantilevers, and cantilevers comprising tips. A support structure can be formed for example from a Si wafer using resist layer and bottom side etch with gold deposition. In addition, U.S. provisional application 60/792,950 filed Apr. 19, 2006 to Mirkin et al. describes support structures, which is hereby incorporated by reference in its entirety (as is US regular application Ser. No. 11/690,738 filed Mar. 23, 2007).

Particularly important design features include, for example, the heights of the silicon ridges and edge standoff spacers which help prevent crushing tips against the underside of the silicon handle wafer.

The support structure in some cases can be fabricated so that it is difficult to view the cantilevers without the presence of the viewports. For example, the support structure may be fabricated from a non-transparent material which does not allow viewing or fabricated from a material such as pyrex which might in principle be transparent but is scratched, or roughened or otherwise used in a way that does not allow viewing. The transparent material can become non-transparent through surface roughening and/or chemical etching, for example.

The support structure can be also described with use of the term "handle wafer."

The support structure also can be adapted for coupling to a larger instrument. The coupling is not particularly limited but can be for example a mechanical coupling, or a magnetic coupling. A structure adapted for this coupling can be attached to the support structure. For example, a plastic clip adapted with magnetic material can be used.

The support structure can be fabricated from single crystal silicon. Advantage over pyrex for example includes etching holes through pyrex can be difficult or expensive or provide surface irregularities which interfere with bonding to cantilevers. Single crystal silicon provides for easier control of the etching.

The support structure can comprise base rows for supporting the cantilevers. Base row length is not particularly limited. For example, the base rows can have an average length of at least about 1 mm. Average length for base row can be, for example, about 0.1 mm to about 5 mm, or about 0.5 mm to about 3 mm. In one embodiment, an array can be made which is about 1 cm by 1 cm and has a base row length of about 10 mm. If base row length becomes too long, one can be limited by bowing of support structure which can exceed the tip height and can keep all tips from touching the writing surface. Base row length can be adapted for each application to avoid this.

The base rows can have a height with respect to the support of at least about 5 microns. This height is not particularly limited but can be adapted for use with the appropriate cantilever bending. The height of the base row can be at or taller than the tip height minus the stop height to keep from crushing tips with overtravel.

The cantilevers can be supported on the base rows, and the base rows in turn can be supported on a larger support structure for the array. The base rows can extend from the larger support for the array. The array support can be characterized by a surface area which is about two square cm or less, or alternatively about 0.5 square cm to about 1.5 square cm. The size can be adjusted as needed for coupling with an instrument.

Support structures can be made of silicon, pyrex, glass, plastic, soft polymers such as siloxane polymers including polydimethylsiloxane.

Array of Cantilevers and Tips

One or two dimensional arrays of cantilevers can be used.

The 2 D array of cantilevers are known in the art. For example, U.S. provisional application 60/792,950 filed Apr. 19, 2006 to Mirkin et al., U.S. provisional application 60/894, 657 filed Mar. 13, 2007 to Haaheim, and U.S. Ser. No. 11/690, 738 filed on Mar. 23, 2007 to Mirkin et al., describe two dimensional arrays of cantilevers.

The two-dimensional array can be a series of rows and columns, providing length and width, preferably substantially perpendicular to each other. The arrays can comprise a first dimension and a second dimension. The two-dimensional array can be a series of one dimensional arrays disposed next to each other to build the second dimension. The two dimensions can be perpendicular. The cantilevers can comprise a free end and a bound end. The cantilevers can comprise tips at or near the free end, distal from the bound end. The cantilevers of one row can point in the same direction as the cantilevers on the next row, or the cantilevers of one row can point in the opposite direction as the cantilevers on the next row.

The two-dimensional arrays can be fabricated into a larger instrumental device by combining two parts, each part having a surface which is patterned in two dimensions and adapted to be mated with each other in the two dimensions. One part can comprise the support structure, without cantilevers, whereas the other part can comprise the cantilevers.

One important variable is the fraction or percentage of the cantilevers in the array which can actually function for the intended purposes. In some cases, some cantilevers can be imperfectly formed, or can be otherwise damaged after formation. A cantilever yield reflects this percentage of usable cantilevers. Preferably, the array is characterized by a cantilever yield of at least 75%, or at least 80%, or at least 90%, or at least 95%, or more preferably, at least about 98%, or more preferably at least 99%. In characterizing the cantilever yield, cantilevers at the ends of rows may be neglected which are damaged by processing of edges compared to internal cantilevers. For example, the central 75% can be measured. In many cases, the fabrication will be better done in the middle rather than the edge as edge effects are known in wafer fabrication. Defect density can increase in some cases as one moves from the center to the edge, or in other cases as one moves from edge to center. One can remove parts which have too high defect density and use remaining parts.

The array can be adapted to prevent substantial contact of non-tip components of the array when the tips are brought into contact with a substantially planar surface. For example, the cantilever arms should not contact the surface and can be accordingly adapted such as by, for example, bending. The tips can be adapted for this as well including, for example, long or tall tips. Factors which can be useful to achieve this result include use of long or tall tips, bending of the cantilever arms, tip leveling, row leveling, and leveling of the cantilevers in all dimensions. One or more combination of factors can be used.

The cantilever tips can be relatively long or tall as known in the art. For example, the tips can have an apex height relative to the cantilever of at least four microns on average, and if desired, the tips can have an apex height relative to the cantilever of at least seven microns on average. In addition, tip apex height can be at least 10 microns, or at least 15 microns, or at least 20 microns. No particular upper limit exists and technology known in the art and improviding can be used. This long length can help ensure that only tips are contacting the surface. Apex height can be taken as an average of many tip apex heights, and in general, apex height is engineered not to vary substantially from tip to tip. Methods known in the art can be used to measure tip apex height including methods shown in the working examples.

In measuring parameters for the array, average measurements can be used. Average measurements can be obtained by methods known in the art including for example review of representative images or micrographs. The entire array does not need to be measured.

Tipless cantilevers can be used in some embodiments, although not a preferred embodiment.

In addition, the cantilevers can be bent including bent towards the surface to be patterned. Methods known in the art can be used to induce bending. The cantilevers can be bent at an angle away from the base and the support. The cantilevers can comprise multiple layers adapted for bending of cantilevers. For example, differential thermal expansion or cantilever bimorph can be used to bend the cantilevers. Cantilever bending can be induced by using at least two different materials. Alternatively, the same materials can be used but with different stresses to provide cantilever bending. Another method is depositing on the cantilever comprising one material a second layer of the same material but with an intrinsic stress gradient. Alternatively, the surface of the cantilever can be oxidized. The cantilevers can be bent at an angle for example of at least 5° from their base, or at least 10° from their base, or at an angle of at least 15° from their base. Methods known in the art can be used to measure this including the methods demonstrated in the working examples. Average value for angle can be used. The cantilevers can be bent on average about 10 microns to about 50 microns, or about 15 microns to about 40 microns. This distance of bending can be measured by methods known in the art including the methods demonstrated in the working examples. Average distance can be used. The bending can result in greater tolerance to substrate roughness and morphology and tip misalignment within the array so that for example a misalignment of about ±20 microns or less or about ±10 microns or less can be compensated.

To facilitate bending, the cantilevers can comprise multiple layers such as two principle layers and optional adhesion layers and can be for example bimorph cantilevers. The cantilevers can be coated with metal or metal oxide on the tip side of the cantilever. The metal is not particularly limited as long as the metal or metal oxide is useful in helping to bend the cantilevers with heat. For example, the metal can be a noble metal such as gold.

In some embodiments, the array can be adapted so that the cantilevers are both bent toward the surface and also comprise tips which are longer than normal compared to tips used merely for imaging.

The tips can be fabricated and sharpened before use and can have an average radius of curvature of, for example, less than 100 nm. The average radius of curvature can be, for example, 10 nm to 100 nm, or 20 nm to 100 nm, or 30 nm to 90 nm. The shape of the tip can be varied including for example pyramidal, conical, wedge, and boxed. The tips can be hollow tips or contain an aperture including hollow tips and aperture tips formed through microfabrication with microfluidic channels passing to end of tip. Fluid materials can be stored at the end of the tips or flow through the tips.

The tip geometry can be varied and can be for example a solid tip or a hollow tip. WO 2005/115630 (PCT/US2005/

014899) to Henderson et al. describes tip geometries for depositing materials onto surfaces which can be used herein.

The tips can be made with polymers including soft polymers like siloxane polymer.

The two dimensional array can be characterized by a tip spacing in each of the two dimensions (e.g., length dimension and width dimension). Tip spacing can be taken, for example, from the method of manufacturing the tip arrays or directly observed from the manufactured array. Tip spacing can be engineered to provide high density of tips and cantilevers. For example, tip density can be at least 10,000 per square inch, or at least 40,000 per square inch, or at least 70,000 per square inch, or at least 100,000 per square inch, or at least 250,000 per square inch, or at least 340,000 per square inch, or at least 500,000 per square inch. The array can be characterized by a tip spacing of less than 300 microns in a first dimension of the two dimensional array and less than 300 microns in a second dimension of the two dimensional array. To achieve even higher density, the tip spacing can be, for example, less than about 200 microns in one dimension and less than about 100 microns, or less than about 50 microns, in another dimension. Alternatively, the tip spacing can be for example less than 100 microns in one dimension and a less than 25 microns in a second direction. The array can be characterized by a tip spacing of 100 microns or less in at least one dimension of the two dimensional array. In one embodiment, tip spacing can be about 70 microns to about 110 microns in one dimension, and about 5 microns to about 35 microns in the second dimension. There is no particular lower limit on tip spacing as fabrication methods will allow more dense tip spacing over time. Examples of lower limits include 1 micron, or 5 microns, or 10 microns so for example tip spacing can be one micron to 300 microns, or one micron to 100 micron.

The number of cantilevers on the two dimensional array is not particularly limited but can be at least about three, at least about five, at least about 250, or at least about 1,000, or at least about 10,000, or at least about 50,000, or at least about 55,000, or at least about 100,000, or about 25,000 to about 75,000. The number can be increased to the amount allowed for a particular instrument and space constraints for patterning. A suitable balance can be achieved for a particular application weighing for example factors such as ease of fabrication, quality, and the particular density needs.

The tips can be engineered to have consistent spacing for touching the surface consistently. For example, each of the tips can be characterized by a distance D spanning the tip end to the support, and the tip array is characterized by an average distance D' of the tip end to the support, and for at least 90% of the tips, D is within 50 microns of D'. In another embodiment, for at least 90% of the tips, D is within 10 microns of D'. The distance between the tip ends and the support can be for example about 10 microns to about 50 microns. This distance can comprise for example the additive combination of base row height, the distance of bending, and the tip height.

Cantilever force constant is not particularly limited. For example, the cantilevers can have an average force constant of about 0.001 N/m to about 10 N/m, or alternatively, an average force constant of about 0.05 N/m to about 1 N/m, or alternatively an average force constant of about 0.1 N/m to about 1 N/m, or about 0.1 N/m to about 0.6 N/m.

The cantilevers can be engineered so they are not adapted for feedback including force feedback. Alternatively, at least one cantilever can be adapted for feedback including force feedback. Or substantially all of the cantilevers can be adapted for feedback including force feedback. For example, over 90%, or over 95%, or over 99% of the cantilevers can be adapted for feedback including force feedback.

The cantilevers can be made from materials used in AFM probes including for example silicon, polycrystalline silicon, silicon nitride, or silicon rich nitride. The cantilevers can have a length, width, and height or thickness. The length can be for example about 10 microns to about 80 microns, or about 25 microns to about 65 microns. The width can be for example 5 microns to about 25 microns, or about 10 microns to about 20 microns. Thickness can be for example 100 nm to about 700 nm, or about 250 nm to about 550 nm. Tipless cantilevers can be used in the arrays, the methods of making arrays, and the methods of using arrays.

Arrays can be adapted for passive pen or active pen use. Control of each tip can be carried out by, for example, piezoelectric, capacitive, electrostatic, or thermoelectric actuation.

The arrays can be adapted for integration of tip coating and ink delivery. For example, microfluidics can be used to control inking and coating of the tips. Tips can be dipped into devices or ink can be delivered directly through internal regions of the tip for hollow tip embodiments.

An important embodiment is that the cantilevers can be bonded to the support structure via gold thermocompression bonding. Important factors can be an inherent force independence of the lithographic process based on cantilever tip deposition and use of low k flexible cantilevers including silicon nitride cantilevers.

Arrays of tips can be fabricated free of cantilevers.

Tips can be adapted to have various tip sizes, arrangements, numbers, sharpnesses, densities, and materials.

Viewport

Fabrication and use of viewports are described in, for example, U.S. Ser. No. 12/073,909 filed Mar. 11, 2008 to Haaheim et al., which is hereby incorporated by reference in its entirety.

FIGS. 1 and 2 illustrate a concept of the viewport or opening wherein the underlying cantilever can be viewed through the support structure through a viewport or an opening.

The viewport can be adapted to allow viewing. In turn, viewing can allow leveling. For example, depth, shape, length, and the width of the viewport can be adapted to allow viewing. If for example, a viewport were too long or too narrow, viewing may become more difficult or not possible. The viewport can be tapered which facilitates viewing or imaging the cantilevers from the opposite side. The top area of the viewport can be larger than the bottom area of the viewport. This can allow enough light to reach the substrate surface and cantilever to illuminate the contact point and reflect off the SiN cantilever, providing a color change which can be used to know when the tip or tips are touching the surface. The top of the opening can be wide enough so that blurring at the top is not an issue when focusing on the bottom.

A plurality or cluster of viewports can be present. For example, the support structure can provide at least two, or at least three, or at least four, or at least five, or at least six viewports. The number of viewports can be adapted in view of the larger instrumental structure. For example, the number of viewports can be correlated with the number of motors used to level the cantilever array. For example, one could use at least one viewport per motor, or use two viewports per motor.

The plurality or cluster of viewports can be adapted and arranged to fit within the optical viewing area of a nanolithography instrument such as the NanoInk NSCRIPTOR. The appearance of the cantilevers can change when they are in two different states: above the surface and in contact with the surface (FIGS. 5D and 5E, respectively). The changes can be due to different reflection of light permitted by open viewports. Image recognition software can be used as needed to detect changes.

The viewports can comprise sloping walls. The sloping walls can be characterized by an angle of slope. For example, a slope angle can be determined by the etching of crystalline silicon (e.g, 54.7 degrees). The viewports can comprise a variety of shapes including for example a pyramidal shape.

The shape of the viewport is not particularly limited as long as it can be made and can allow for viewing. The size of the viewport can be varied for an application as needed. For example, a lateral dimension of the viewport at the first side (away from the cantilevers) such as width can be for example about one micron to about 1,000 microns, or about 250 microns to about 750 microns. The viewport can be sufficiently small so that the structure is not destabilized. The viewport dimensions can be limited by the pitch of the ridges in one direction, but laterally can be unlimited in for example another direction.

Viewing through the viewport can be facilitated with optical devices such as a microscope. For example, microscopes can be used which are used in AFM and similar devices. The microscope can have for example a long working distance lens. The NanoInk NSCRIPTOR lens can be for example a 10× objective lens. An onboard camera can be used with further zoom capability. The resulting video image can be for example about 300 microns× about 400 microns.

Another advantage of a viewport is that it can provide laser access which for example can allow laser feedback from the cantilevers.

One can use the viewports first to work in a sacrificial area of a substrate to for example perform leveling and surface checks and then later move to a patterning area.

Non-Viewport Embodiments

Viewports can enable good function, although good function can be achieved without use of viewports. One can identify a point of reference in x-y. With a transparent or translucent handle chip/wafer, one can look through it at three or more different points in x-y to determine planarity. If electrical contact is used, one can measure contact at three different x-y points.

Leveling Prior to Lithography

Because the 2 D nano PrintArray device is often imperfectly parallel (level) to the substrate, a pertinent question during processing becomes how to achieve and verify uniform contacts of all of the tips, or many or a majority of the tips, without driving the corners of the array into the sample, which would lead to sample scratching, pattern distortion, and/or arraying fishtailing during lithography. The "levelness" (or "planarity") of the 2 D nano PrintArray with respect to the substrate can be described in terms of the relative z positions of three distinct points on the 2 D nano PrintArray as measured by z-axis motors, or as two relative angular difference measurements as measured by goiniometer motors (i.e., ($\phi$, $\theta$). A schematic illustration of these parameters is provided in FIG. 6.

The concept of Freedom of Travel (F.O.T.) can be particularly important in this process. FIG. 1 illustrates this concept for one embodiment in which a planar 2 D nano PrintArray with 6 µm F.O.T., where (A) illustrates a "feather touch" situation (where the tips are just beginning to touch the substrate), and (B) illustrates the "hard crunch" (where the cantilevers have gone through their full 6 µm freedom of travel, and the array is now grounding out on the standoffs). Thus, in this embodiment, initial z-positioning of anywhere from 0.1 to 5.9 µm within the F.O.T. can yield excellent lithography with uniform contact, while the extreme of 0.0 µm can lead to no writing (i.e., no contact), and 6.0 µm can lead to distorted writing (standoffs grounding out). In other words, in this embodiment, after making first contact (i.e., uniform contact) with the substrate, there was a 6.0 µm margin of error before grounding out on the standoffs. A scanning electron microscopy (SEM) image of another embodiment of the 2 D nano PrintArray with a F.O.T. of 19.5 µm is provided in FIG. 7. Note that the F.O.T. of a cantilever can be limited in principle mostly by the length of the cantilever itself; for example, if the cantilever is perpendicular to the substrate, then F.O.T. is the length of the cantilever.

FIG. 2 illustrates a situation where the 2 D nano PrintArray was not perfectly planar, but still within the tolerance to achieve uniform writing. (1) and (2) show that by the time first contact was observed in the "lowest" viewport, the cantilevers at the edge of the device have already deflected 2.30 µm. Cantilever deflection can be monitored for example by observing how and when the cantilevers naturally change color; one example of this color change is shown in FIG. 5. According to (3), after another 1.40 µm, the "highest" viewport was deflecting, but there was still another 2.30 µm to deflect until all the cantilevers tips were uniformly touching (4), thereafter there would be no margin of error, and the standoff was nearly touching the substrate.

In the embodiment where the F.O.T. is 6.0 µm, the differences in z-positions between the highest and lowest viewports, as well as one angular difference measurement $\Delta\phi_2$, can be estimated with the approximation shown in FIG. 8. These measurements can then provide an indicator of the amount the motors need to be moved to improve planarity; FIG. 9 illustrates an example of a first order approximation of the ratios of the difference in z-different as observed by the viewports to the amount of motors need to be moved. In general, the higher the F.O.T. of the array and the smaller the z-difference between "highest" and "lowest" viewports, the easier it was to achieve uniform contact and lithography.

Leveling with Software Routine and User Interface

One leveling approach that has been employed involves bringing the scanner in contact with the device on the sample surface with a small amount of epoxy. One disadvantage of this method is that epoxy takes about one hour to dry and can introduce volume distortion, which in turn could adversely affect leveling. Generally, leveling is performed by correcting the differences in the z-height obtained by generally a combination of visual inspection and measuring the motors positions.

The presently claimed inventions can generally eliminate the use of epoxy and provides a user-friendly computer interface, allowing the operator of the leveling instrument to gain device planarity efficiently and accurately. The user interface can be part of the software routine, which can be called, for example, INKLEVELER, which can be operated within an instrument such as, for example, NSCRIPTOR. Examples of the software interface are provided in FIGS. 11 and 12, wherein a display of the default configurations and blueprint of the hardware and that of the 2D nano PrintArray, respectively, are illustrated. Together with visual inspection of the device planarity, the routine provides a microscale leveling method for the device that can be iterative, utilizing both the motors and particularly the z-piezoelectric extender, actuator, or sensor ("z-piezo") to provide better measurements of the differences in the z-height among the viewports, and providing a more accurate means to minimize these differences. It is noted that the instrument need not only comprise of one z-piezo; it can comprise two, three, or more z-piezos as needed. A exemplary flowchart is provided in FIG. 3 to summarize the leveling steps involved in one of the embodiments. Illustrating examples of the user interface and detailed descriptions of the software routine are provided in the embodiments.

Note that the capabilities of the software, in combination of the leveling hardware instrumentation, need not be limited by those described herein. In fact, one important feature of the presently claimed inventions can be the potential for the software to be adapted or be adaptable for future modifications, further improving its functionality. For example, the image recognition method for cantilever deflection can be improved to provide better detection of the deflection, thereby improving the planarity of the array. The sensing capability of the piezoelectric extender, actuator, or sensor can also be improved via better instrumentation or operational control through the software. Additionally, conductive sensors can be used as the sensing instrumentation. Moreover, the software can be adapted to provide automated measurements with minimal user input and/or automated iterative calculations during leveling.

Macroscale Leveling ("Eyeballing")

This method can provide a means to level the substrate macroscopically, relying on a human naked eye's ability to maneuver the 2 D nano PrintArray within about 500 and about 800 µm of the substrate and to use the z-motors to make corrections to account for gross planar misalignment. It is meant to provide an approximation and is generally performed prior to the subsequent microscale leveling. It is noted that the number of viewports, and hence the, number of motors controlling alignment of the substrate can be three, four, five, or more.

In one embodiment, macroscale leveling was accomplished via the following steps:

1. A backlight reflector was attached to the scanner assembly to aid in eyeballing. Kimwipe® was taped and draped behind the puck of the NSCRIPTOR scanner (NanoInk, Inc.) to further aid visual inspection. Note that any lightly colored surface may be used for this purpose. The puck and array were optionally taken out, and the scanner was optionally pulled out of its cartridge assembly. The puck, array, and scanner assembly were returned upon completion of this step.

2. The 2 D nano PrintArray was mounted on the scanner. The scanner was returned to its home position in the cartridge, and all of the z-axis motors were at the tops of their individual ranges. The sample puck was in place, with an about 1×2 cm$^2$ sample loaded. The array was positioned in X-Y over the 1 cm$^2$ "sacrificial" planar alignment area of the substrate.

3. The optics were adjusted to bring the cantilevers of one viewport (for example, viewport 1a) into focus; the camera was zoomed.

4. A flexible LED illuminators was placed on the NSCRIPTOR stage. The setup was positioned such that maximum backlighting (i.e., so that the Kimwipe sheets glow a uniformly white color) was obtained.

5. The large scale motor corrections were estimated to bring the array closer to alignment.

6. The z-all position (i.e., position of the entire array) was moved down in increments of 100 µm.

7. As the 2 D nano PrintArray got closer to the substrate, angular differences were corrected subsequently to improve alignment.

8. Each eye of the user was kept on the level of the substrate and perpendicular to the array along the horizontal axis. Combinations of one eye viewing with the other closed (used for enhancement of lateral accuracy) and two eye viewing (used for enhancement of perspective) were employed.

9. A mirror was inserted perpendicularly to the y-axis to double check planarity along the x-axis.

10. Motor corrections were initiated, and if necessary, they were applied to individual motors.

11. The adjustments applied to each motor were recorded.

12. Once the array is about 100 µm above the surface, microscale leveling was employed.

Micro-Leveling Through the Viewports

In some embodiments, leveling was performed via NSCRIPTOR instrument (NanoInk, Inc) in conjunction with at least one array comprising at least one cantilever optionally further comprising tips. Upon completion of macroscale leveling, the cantilever deflection was monitored and controlled by the motors and the z-piezo through the viewports to bring leveling within the tolerances dictated by the device's important or critical dimensions. An exemplary flowchart is provided in FIG. 10 to summarize one example of the iterative process. Note that the iterative calculations were performed by the software routine, and the entire process need only be performed once for the same assembly.

In one embodiment, the micro-leveling procedure can be described as follows:

1. After the 2 D nano PrintArray was leveled via eyeballing, the LED backlight illuminators and the laser attached to the scanner were turned off to conserve battery life.

2. The extend value of the z-piezo was set to 10 V by creating a 5 second dwell time in the INKCAD software. A graphical illustration of a INKCAD interface is provided in FIG. 4. The z-piezo was extended using the "Pen Down" button.

3. The optics over any one of the three viewports were positioned to lower the PrintArray onto the substrate surface using 20, 10, and then 5 µm steps in order to map the cantilever deflection. It was noted that from roughly 100 µm down to about 10 µm above the substrate, the cantilevers underwent a gradual color shift, as illustrated in FIG. 5; however, once near the surface and in contact, the color shift became dramatic.

4. The observed deflection behavior is provided in FIG. 5. Note that this is just one of several possible examples of cantilever deflection—others can become more distinct varieties of yellow, green, and/or pink, depending on the lighting and the angle of viewing. The working range of the motor motion and the corresponding cantilever deflection were verified by applying a 25-30 µm displacement back and forth several times. Additionally, the method of detection is not limited to observing a change of color; for example, any apparent change of visual appearance, such as intensity of reflection or extent of cantilevers' uncurling, can be used. Because the NSCRIPTOR optics had significant backlash components, the cantilevers had to be frequently refocused to observe deflection.

5. After the relative deflection characteristics of the cantilevers at each viewport have been identified, the user chose any one of the viewports and bring the array into contact with the surface. Note that the user can choose any viewports, but to facilitate identification, the first to be chosen was named the "1" group, the second "2" group, and the third "3" group. Note that the leveling can be more accurate if the user used the outer ring B viewports.

6. In each viewport, the z-all position (i.e., position of the entire array) was used to make rough measurements of the deflections at the three different viewports. The "z-probe" value was read from the "probe z-position" indicator on the interface panel, and the z-all position was provided when a given viewport showed deflection. The result of this step is shown in the FIG. 13.

7. A control button such as "Execute leveling" was pressed, and the entire array (z-all position) was lifted off the surface by 100 μm, whereupon the individual z-axis motors corrected their positions based upon the input z-probe values. Thereafter the array returned to within about 20 μm above the surface.

8. At the same viewport, the array was brought back into contact with the surface using z-all. The z-piezo was fully extended, and all of the viewports showed some amount of deflection. FIG. 15 provides an exemplary display of the user interface prompting the user to enter the z-piezo position. It was ascertained that none of the viewports showed deflection when the z-piezo was fully retracted.

9. At each viewport, the z-piezo position tool was used to make fine measurements of three different viewport's deflections. The z-all was not adjusted. The z-probe value thus was the sum of the static "probe z-position" and the dynamic z-piezo position.

10. If the user entered invalid z-probe values, the "execute leveling" button remained disabled; if the user entered valid data but the array required further leveling, the "execute leveling" button was enabled; if the probe values indicated that the array was already level, the user could proceed to next step or repeat step 9 (see FIG. 13). Note the user can always repeat step 9 to achieve increasingly fine degrees of planarity.

11. Z-all was withdrawn 20 μm, and the z-piezo was fully extended.

12. The viewport with the clearest deflection characteristics was focused, and the z-all was lowered until those cantilevers began to deflect.

13. The amount indicated in FIG. 14 was entered as the "minimum amount past touchdown" on the user interface (FIG. 13E) to ascertain all the tips were uniformly touching the surface. The amount was provided by the software.

14. The z-piezo was fully retracted to bring all of the tips out of contact. Lithography commenced.

Note that laser was not used for any part of planar leveling. The normal tip approach routines, as provided by the AFM operation software, were not used for as part of planar leveling, either.

FIG. 16 (A-B) provides an example of the patterning result without employing the leveling described herein, as observed via optical microscopy. The area of the 1 cm$^2$ 2 D nano PrintArray was illustrated as a box. In some of the figures it could be seen that patterning did not occur due to a lack of contact between the cantilever tips and the substrate. Also, the lines X patterns in FIG. 16(B) were not very straight.

By contrast, FIG. 17 (A-B) provides an example of the patterning result after the micro-leveling was performed. Patterning occurred for almost every cantilever on the array, and the lines of the X patterns were straighter and sharper. Note that the gaps in FIG. 17(B) were attributed to broken tips, rather than a lack of cantilever tip contact with the substrate.

In a variety of embodiments, as a result of the micro-leveling, at least 50%, preferably at least 70%, more preferably at least 90%, or even more preferably at least 95% of the non-broken tips touched the substrate and contributed to patterning.

The leveling techniques described herein can provide a fast and accurate method to level the substrate, thereby providing uniform contacts between the cantilever tips and the substrate to improve reproducibility and accuracy of printing or patterning process.

Additional Embodiments

Different embodiments can be present for determining point of contact. These include, for example, cantilever deflection, any observable color change from a tip or from a cantilever, sign of movement in the x-y plane representing skidding, deformation or change of shape (particularly, for example, if translucent polymer tips are used), change in size, focus, or shading. Human judgement or image recognition software can be used to determine point of contact.

Specific ranges can be determined for the point of contact. A degree of accuracy can be determined such as, for example, ±200 nm or ±100 nm.

In another embodiment, the cantilever and tip can be engineered to provide one or more bright spots near or at the tips which can be monitored for an indicator of when the tip touches the surface, or the point of contact. For example, in one embodiment, a ratio of stoichiometric to low stress SiN in bimorph configuration can be adapted to provide bright spots. For example, a thickness ratio can be about 1,000:3,000 in angstroms. In addition, freedom of travel and curl can be adapted also to control the bright spots.

Registration to existing surface features can be carried out. For example, the tip can be aligned in the x-y directions to existing locations with respect to the substrate.

Substrate size can be varied for the application. For example, a substrate can be at least one square mm, or at least five square mm, or at least 25 square mm.

What is claimed:

1. A method comprising:
   providing at least one array of cantilevers supported by at least one support structure,
   providing at least one substrate,
   providing at least one instrument comprising motors and a piezoelectric extender to control the position of the array with respect to the substrate, and
   leveling the array with respect to the substrate, wherein the leveling step comprises inputting positional information from the motors and piezoelectric extender into the instrument via a user interface to indicate when at least one cantilever deflects from contact with the substrate.

2. The method according to claim 1, wherein the array is a one dimensional array of cantilevers.

3. The method according to claim 1, wherein the array is a two dimensional array of cantilevers.

4. The method according to claim 1, wherein the array comprises at least 250 cantilevers.

5. The method according to claim 1, wherein the array comprises at least 10,000 cantilevers.

6. The method according to claim 1, wherein the array comprises at least 55,000 cantilevers.

7. The method according to claim 1, wherein the cantilevers are bent at an angle away from the support structure.

8. The method according to claim 1, wherein the cantilevers are bent at an angle of at least 5° away from the support structure.

9. The method according to claim 1, wherein at least some of the cantilevers comprise tips.

10. The method according to claim 1, wherein at least some of the cantilevers do not comprise tips.

11. The method according to claim 1, wherein the cantilevers comprise tips adapted for transferring materials from the tips to the substrate surface.

12. The method according to claim 1, wherein the cantilevers comprise tips adapted for AFM measurements.

13. The method according to claim 1, wherein the cantilevers comprise tips adapted for lithography.

14. The method according to claim 1, wherein the support structure comprises silicon.

15. The method according to claim 1, wherein the support structure is a silicon support structure.

16. The method according to claim 1, wherein the support structure comprises at least one viewport adapted to allow viewing of the cantilevers.

17. The method according to claim 1, wherein the support structure comprises at least one edge standoff spacer.

18. The method according to claim 1, wherein the support structure comprises gold adapted to support the array of cantilevers to the support structure.

19. The method according to claim 1, wherein the support structure comprises at least three viewports adapted to allow viewing of at least some of the cantilevers.

20. The method according to claim 1, wherein the support structure comprises at least one viewport adapted to allow viewing of the cantilevers, and the viewport comprises sloping walls.

21. The method according to claim 1, wherein the substrate is flat.

22. The method according to claim 1, wherein the substrate is not flat.

23. The method according to claim 1, wherein the substrate is at least one cm long and at least one cm wide.

24. The method according to claim 1, wherein the leveling results in the differences between the relative positions of the viewports being less than about 500 nm.

25. The method according to claim 1, wherein the leveling results in partial extension of at least one z-axis piezoelectric extender.

26. The method according to claim 1, wherein the instrument comprises at least one z-axis piezoelectric extender.

27. The method according to claim 1, wherein the positional information is obtained via at least three viewports.

28. The method according to claim 1, wherein the motors are z-axis motors.

29. The method according to claim 1, wherein the motors are goiniometer motors.

30. The method according to claim 1, wherein the piezoelectric extender is partially extended during the leveling.

31. A method comprising:
providing at least one array of cantilevers supported by at least one support structure comprising at least one viewport,
providing at least one substrate,
providing at least one instrument to control the position of the array with respect to the substrate, and
leveling the array with respect to the substrate,
wherein the leveling is performed with the instrument, and
wherein the instrument comprises software and a user interface adapted to provide operational control and iterative measurements of differences between the relative positions of the viewports with respect to the substrate.

32. The method according to claim 31, wherein the array is a one dimensional array of cantilevers.

33. The method according to claim 31, wherein the array is a two dimensional array of cantilevers.

34. The method according to claim 31, wherein the array comprises at least 250 cantilevers.

35. The method according to claim 31, wherein the array comprises at least 10,000 cantilevers.

36. The method according to claim 31, wherein the array comprises at least 55,000 cantilevers.

37. The method according to claim 31, wherein the cantilevers are bent at an angle away from the support structure.

38. The method according to claim 31, wherein the cantilevers are bent at an angle of at least 5° away from the support structure.

39. The method according to claim 31, wherein at least some of the cantilevers comprise tips.

40. The method according to claim 31, wherein at least some of the cantilevers do not comprise tips.

41. The method according to claim 31, wherein the cantilevers comprise tips adapted for transferring materials from the tips to the substrate surface.

42. The method according to claim 31, wherein the cantilevers comprise tips adapted for AFM measurements.

43. The method according to claim 31, wherein the cantilevers comprise tips adapted for lithography.

44. The method according to claim 31, wherein the support structure comprises silicon.

45. The method according to claim 31, wherein the support structure is a silicon support structure.

46. The method according to claim 31, wherein the support structure comprises at least one viewport adapted to allow viewing of the cantilevers.

47. The method according to claim 31, wherein the support structure comprises at least one edge standoff spacer.

48. The method according to claim 31, wherein the support structure comprises gold adapted to support the array of cantilevers to the support structure.

49. The method according to claim 31, wherein the support structure comprises at least three viewports adapted to allow viewing of at least some of the cantilevers.

50. The method according to claim 31, wherein the support structure comprises at least one viewport adapted to allow viewing of the cantilevers, and the viewport comprises sloping walls.

51. The method according to claim 31, wherein the substrate is flat.

52. The method according to claim 31, wherein the substrate is not flat.

53. The method according to claim 31, wherein the substrate is at least one cm long and at least one cm wide.

54. The method according to claim 31, wherein the leveling results in the differences between the relative positions of the viewports being less than about 500 nm.

55. The method according to claim 31, wherein the leveling results in partial extension of at least one z-axis piezoelectric extender.

56. The method according to claim 31, wherein the instrument comprises at least one z-axis piezoelectric extender.

57. The method according to claim 31, wherein the software monitors and controls at least one z-axis piezoelectric extender and at least three z-axis motors.

58. The method according to claim 31, wherein the software monitors and controls at least one z-axis piezoelectric extender or at least two goiniometer motors.

59. The method according to claim 31, wherein the software is adaptable for future modifications.

60. The method according to claim 31, wherein the user interface prompts the operator for inputs.

61. A method comprising:
providing at least one array of cantilevers, providing at least one substrate,
providing at least one instrument to control the position of the array, and
leveling the array with respect to the substrate,
wherein the instrument comprises at least one piezoelectric extender and at least three motors, and
wherein the piezoelectric extender and the motors are adapted to provide the leveling of the array.

62. The method according to claim 61, wherein the array is one dimensional.

63. The method according to claim 61, wherein the array is two dimensional.

64. The method according to claim 61, wherein the substrate is flat.

65. The method according to claim 61, wherein the substrate is not flat.

66. The method according to claim 61, wherein the substrate is at least one cm wide and at least one cm long.

67. The method according to claim 61, wherein the leveling is performed using partial extension of the piezoelectric extender.

68. The method according to claim 61, wherein the piezoelectric extender and the motors are controlled and monitored by a software.

69. The method according to claim 61, wherein the substrate is a biological molecule.

70. The method according to claim 61, wherein the position is monitored by at least one viewport.

71. A method comprising:
providing at least one array of cantilevers comprising cantilever tips,
providing at least one substrate,
wherein the position of the array of cantilever tips with respect to the substrate is controlled by at least one z-piezoelectric extender and at least three z-axis motors in a triangular, surrounding relationship with respect to the array,
wherein the z-axis motors are adapted to raise and lower the cantilever tips with respect to the substrate,
adjusting the z-axis motors until all the cantilever tips are substantially level with respect to the substrate to an unaided eye,
positioning the array so that the cantilevers deflect by a non-negligible amount while fully extending the z-piezoelectric extender,
adjusting the z-piezoelectric extender to determine the relative position of the z-axis motors, and
recording the positions for future calibration reference so that the method needs to be performed once.

72. A method of leveling comprising:
providing at least one surface with topographical features,
providing at least one substrate,
providing at least one instrument to control the spatial position of the array, and
leveling the array with respect to the substrate,
wherein the instrument comprises at least one piezoelectric extender and at least three motors adapted to provide the leveling of the array.

73. A method comprising:
providing at least one surface with topographical features,
providing a substrate,
wherein the position of the features with respect to the substrate is controlled by at least piezoelectric extender and at least three motors in a triangular, surrounding relationship with respect to the surface,
wherein the motors are adapted to raise and lower the features with respect to the substrate,
adjusting the motors until all the features are substantially level with respect to the substrate to an unaided eye,
positioning the array so that the surface features touch the substrate by a non negligible amount,
adjusting the piezoelectric extender to determine the relative position of the motors, and
recording the positions for future calibration references so that the method needs to be performed once.

74. A software routine comprising a user interface, wherein the routine prompts a user to perform measurements and input measurement results via the interface, the routine performs calculations based on the results and controls and monitors at least one piezoelectric extender and at least three motors to provide leveling of a device with respect of a substrate.

75. A software routine comprising a user interface, wherein the routine can be adapted to perform automated measurements and iterative calculations and controls and monitors at least one piezoelectric extender and at least three motors to provide leveling of a device with respect of a substrate.

76. The software routine according to claim 74, wherein the device comprises one dimensional or two dimensional array of cantilevers.

77. The software routine according to claim 74, wherein the software routine controls and monitors at least one piezoelectric extender and at least three motors.

78. The software routine according to claim 74, wherein the leveling results in a maximum deviation from planarity of 500 nm in z-height.

79. The software routine according to claim 74, wherein the leveling is performed using partial extension of the piezoelectric extender.

80. A method comprising:
providing at least one array of cantilevers supported by at least one support structure,
providing at least one substrate,
providing at least one instrument comprising motors to control the position of the array with respect to the substrate, and
leveling the array with respect to the substrate, wherein the leveling step comprises inputting positional information from the motors into the instrument via a user interface to indicate when the at least one cantilever deflects from contact with the substrate.

81. A method comprising:
providing at least one array of nanoscopic tips supported by at least one support structure,
providing at least one substrate,
providing at least three points of reference in X-Y plane with respect to the substrate to determine points of contact between tips and substrate,
providing at least one instrument comprising motors and a piezoelectric extender to control the position of the array with respect to the substrate,
leveling the array with respect to the substrate,
wherein the leveling step comprises inputting positional information from the motors and piezoelectric extender into the instrument via the user interface to indicate when at least one nanoscopic tip contacts the surface.

82. The method of claim 1, wherein the leveling step comprises determining when at least one cantilever deflects from contact with the substrate by observing at least one of (i) a change in a visual appearance of the at least one cantilever through a viewport in the support structure, (ii) a change in the visual appearance of the at least one cantilever through the support structure where the support structure is transparent or translucent, (iii) an electrical contact between the at least one cantilever and the substrate, (iv) an extent of uncurling of the at least one cantilever, and (v) an intensity of reflection within a viewport in the support structure.

83. The method of claim 80, wherein the leveling step comprises determining when the at least one cantilever deflects from contact with the substrate by observing at least one of (i) a change in a visual appearance of the at least one cantilever through a viewport in the support structure, (ii) a change in the visual appearance of the at least one cantilever through the support structure where the support structure is transparent or translucent, (iii) an electrical contact between the at least one cantilever and the substrate, (iv) an extent of uncurling of the at least one cantilever, and (v) an intensity of reflection within a viewport in the support structure.

* * * * *